United States Patent
Hashizume et al.

(10) Patent No.: US 10,403,513 B2
(45) Date of Patent: Sep. 3, 2019

(54) MANUFACTURING METHOD OF SEMICONDUCTOR DEVICE AND SEMICONDUCTOR DEVICE

(71) Applicant: Renesas Electronics Corporation, Tokyo (JP)

(72) Inventors: Shoji Hashizume, Takasaki (JP); Keita Takada, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/900,416

(22) Filed: Feb. 20, 2018

(65) Prior Publication Data

US 2018/0277397 A1    Sep. 27, 2018

(30) Foreign Application Priority Data

Mar. 21, 2017  (JP) .................................. 2017-054230

(51) Int. Cl.
*H01L 21/56* (2006.01)
*H01L 23/495* (2006.01)
(Continued)

(52) U.S. Cl.
CPC ........ *H01L 21/565* (2013.01); *B29C 45/0025* (2013.01); *B29C 45/0046* (2013.01); *B29C 45/14336* (2013.01); *B29C 45/14655* (2013.01); *H01L 21/4825* (2013.01); *H01L 21/4842* (2013.01); *H01L 23/3114* (2013.01); *H01L 23/4952* (2013.01); *H01L 23/49503* (2013.01); *H01L 23/49513* (2013.01); *H01L 23/49541* (2013.01); *H01L 23/49548* (2013.01); *H01L 23/49562* (2013.01); *H01L 23/49575* (2013.01); *H01L 23/544* (2013.01); *B29C 2045/0027* (2013.01); *B29L 2031/34* (2013.01); *H01L 2223/54433* (2013.01); *H01L 2224/32245* (2013.01); *H01L 2224/48091* (2013.01); *H01L 2224/48247* (2013.01);
(Continued)

(58) Field of Classification Search
USPC ....................................................... 257/670
IPC ................. H01L 23/49503,23/49541, 23/3114, 21/565, 23/49513, 23/4952, 23/49548, 23/49562, 23/49575, 21/4825, 21/4842, 23/544, 2224/73265, 2224/49171, 2223/54433, 2224/48091, 2924/00014, 2924/181, 2924/00012, 2224/32225, 2224/48247, 2924/00, 2224/32245; B29C 45/14655, 45/14336, 45/0046, 45/0025, 2045/0027; H02P 27/06; B29L 2031/34
See application file for complete search history.

(56) References Cited

FOREIGN PATENT DOCUMENTS

JP    H 08-46119 A    2/1996
JP    2012-109435 A   6/2012

*Primary Examiner* — Hrayr A Sayadian
(74) *Attorney, Agent, or Firm* — McGinn IP Law Group, PLLC.

(57) ABSTRACT

In a manufacturing method of a semiconductor device, by arranging a lead in the vicinity of a gate portion serving as a resin injection port of a mold, a void is prevented from remaining within an encapsulation body when two semiconductor chips arranged so as to overlap in the Y direction are encapsulated with resin. Further, a length of an inner lead portion of the lead in the Y direction is greater than a length of an inner lead portion of another lead overlapping a chip mounting portion in the Y direction.

7 Claims, 19 Drawing Sheets

(51) Int. Cl.
*H01L 21/48* (2006.01)
*H01L 23/544* (2006.01)
*B29C 45/14* (2006.01)
*B29C 45/00* (2006.01)
*H01L 23/31* (2006.01)
*B29L 31/34* (2006.01)
*H02P 27/06* (2006.01)

(52) U.S. Cl.
CPC ............... *H01L 2224/49171* (2013.01); *H01L 2224/73265* (2013.01); *H01L 2924/181* (2013.01); *H02P 27/06* (2013.01)

MANUFACTURING METHOD OF SEMICONDUCTOR DEVICE AND SEMICONDUCTOR DEVICE

CROSS-REFERENCE TO RELATED APPLICATION

The present application claims priority from Japanese Patent Application No. 2017-054230 filed on Mar. 21, 2017, the content of which is hereby incorporated by reference into this application.

TECHNICAL FIELD OF THE INVENTION

The present invention relates to a manufacturing method of a semiconductor device and a semiconductor device, and relates to, for example, a technique effectively applied to a manufacturing method of a semiconductor device having a plurality of semiconductor chips and a plurality of leads that are encapsulated with resin, and this semiconductor device having the same.

BACKGROUND OF THE INVENTION

FIG. 2 of Japanese Patent Application Laid-open Publication No. 2012-109435 (Patent Document 1) has disclosed a semiconductor device having two semiconductor chips CH1 and CH2 mounted on a die pad 2 that are encapsulated with resin.

Japanese Patent Application Laid-open Publication No. H08-46119 (Patent Document 2) has disclosed a technique in which a shape of a lead frame is devised in order to prevent a void from forming during a resin-encapsulating process of a semiconductor element.

SUMMARY OF THE INVENTION

The inventors of the present application have studied an SOP (Small Outline Package) type semiconductor device having semiconductor chips that are encapsulated with resin. In this semiconductor device, a plurality of first leads are arranged on a first long side of a main surface of an encapsulation body, and a plurality of second leads are arranged on a second long side opposite to the first long side of the main surface of the encapsulation body. Further, the plurality of first leads arranged on the first long side include a plurality of third leads electrically connected with one of the semiconductor chips and a plurality of fourth leads not connected with this semiconductor chip, and the plurality of third leads are designed to be as short as possible such that the semiconductor device is capable of operating at high speed. In addition, the plurality of fourth leads have the same length as the plurality of third leads and are short in structure.

In addition, in the resin-encapsulating (molding) process for encapsulating the semiconductor chips, a gate portion that serves as an injection port for injecting resin into a cavity of a mold is arranged on a first short side of the main surface of the encapsulation body, and a vent portion that serves as a discharge port for discharging the air and resin within the cavity is arranged on a second short side opposite to the first short side. Further, since the plurality of fourth leads arranged close to the first short side on which the gate portion is arranged are short, a gap portion in which no lead is present is formed in the vicinity of the gate portion.

The inventors of the present application have recognized a problem in which reliability of the semiconductor device is decreased by air bubbles (voids or vacancies) formed due to the presence of the gap portion and remaining within the encapsulation body in the resin-encapsulating process of the semiconductor device, as will be described in detail below.

Other problems and novel features will be apparent from the description in the present specification and the attached drawings.

According to one aspect of the present invention, a manufacturing method of a semiconductor device includes the steps of:

(a) preparing a lead frame having: a first tie bar extending in a first direction in plan view so as to couple a plurality of first leads to one another; a second tie bar extending in the first direction in plan view so as to couple a plurality of second leads to one another; a coupling portion coupled to the first tie bar and the second tie bar; a first chip mounting portion arranged between the first tie bar and the second tie bar in plan view; and a second chip mounting portion arranged between the first chip mounting portion and the second tie bar in plan view;

(b) after the step (a), mounting a first semiconductor chip on the first chip mounting portion and mounting a second semiconductor chip on the second chip mounting portion; and (c) after the step (b), sandwiching the lead frame, on which the first semiconductor chip and the second semiconductor chip are mounted, between a first mold and a second mold, and then supplying resin into a cavity defined by the first mold and the second mold via a gate portion that is formed on the first mold and is provided at a position overlapping the coupling portion of the lead frame to form an encapsulation body that encapsulates a portion of each of the first leads, a portion of each of the second leads, the first chip mounting portion, the second chip mounting portion, the first semiconductor chip, and the second semiconductor chip.

Further, according to this manufacturing method of a semiconductor device, the plurality of first leads each include an inner lead portion covered by the encapsulation body and an outer lead portion exposed to the outside of the encapsulation body, the plurality of first leads include: a third lead having the inner lead portion located between the first tie bar and the first chip mounting portion in a second direction orthogonal to the first direction; and a fourth lead having the inner lead portion not located between the first tie bar and the first chip mounting portion, in plan view, the first chip mounting portion includes: a first side extending along the first tie bar; a second side opposite to the first side; a third side extending along the second direction; and a fourth side opposite to the third side and extending along the second direction, in plan view, the first side of the first chip mounting portion is located between the first tie bar and the second side of the first chip mounting portion, a distance in the second direction from the first side of the first chip mounting portion to a first virtual line extending in the first direction and passing through a midpoint of the first tie bar and the second tie bar in the second direction is greater than a length of the inner lead portion of the third lead in the second direction, a length of the inner lead portion of the fourth lead in the second direction is greater than the length of the inner lead portion of the third lead in the second direction, in the step (c), when the lead frame is sandwiched between the first mold and the second mold, the gate portion of the first mold is located closer to the first tie bar than to the second tie bar in plan view, in the step (c), when the lead frame is sandwiched between the first mold and the second mold, a portion of the inner lead portion of the fourth lead is located between the first chip mounting portion and the gate portion in plan view, in the step (c), when the lead frame is sandwiched between the first mold and the second mold, a spacing between the portion of the inner lead portion of the fourth lead and the gate portion in the first direction is smaller than a spacing between the portion of the inner lead portion of the fourth lead and the first chip mounting portion in the first direction, and in the step (c), the resin is supplied into the cavity with the lead frame sandwiched between the first mold and the second mold such that the portion of the inner lead portion of the fourth lead is located on a second virtual line passing through the gate portion and extending in the first direction in plan view.

According to another aspect of the present invention, a semiconductor device includes:

a first semiconductor chip; a second semiconductor chip; a first chip mounting portion on which the first semiconductor chip is mounted; a second chip mounting portion on which the second semiconductor chip is mounted; a plurality of first leads and a plurality of second leads each arranged on a corresponding periphery of the first chip mounting portion and the second chip mounting portion; and an encapsulation body encapsulating the first semiconductor chip, the second semiconductor chip, the first chip mounting portion, the second chip mounting portion, a portion of each of the first leads, and a portion of each of the second leads.

Further, according to this semiconductor device, the encapsulation body includes a main surface and a back surface opposite to the main surface, in plan view, the main surface includes: a first side extending along a first direction; a second side opposite to the first side; a third side extending along a second direction orthogonal to the first direction; and a fourth side opposite to the third side, the encapsulation body further includes: a first side surface attaching the first side to the back surface; a second side surface attaching the second side to the back surface; a third side surface attaching the third side to the back surface; and a fourth side surface attaching the fourth side to the back surface, the third side surface includes a resin injection trace, in plan view, the plurality of first leads are arranged along the first side of the main surface, in plan view, the plurality of second leads are arranged along the second side of the main surface, the plurality of first leads each include an inner lead portion covered by the encapsulation body and an outer lead portion exposed to the outside of the encapsulation body, the plurality of first leads include: a third lead having the inner lead portion located between the first side and the first chip mounting portion in the second direction; and a fourth lead having the inner lead portion not located between the first side and the first chip mounting portion, in plan view, the first chip mounting portion includes: a fifth side extending along the first side; a sixth side opposite to the fifth side; a seventh side extending along the third side; and an eighth side opposite to the seventh side and extending along the fourth side, in plan view, the fifth side of the first chip mounting portion is located between the first side and the sixth side of the first chip mounting portion, a distance in the second direction from the fifth side of the first chip mounting portion to a first virtual line extending in the first direction and passing through a midpoint of the first side and the second side in the second direction is greater than a length of the inner lead portion of the third lead in the second direction, a length of the inner lead portion of the fourth lead in the second direction is greater than the length of the inner lead portion of the third lead in the second direction, the resin injection trace is located closer to the first side than to the second side in plan view, a portion of the inner lead portion of the fourth lead is located between the first chip mounting portion and the resin injection trace in plan view, in plan view, a spacing between the portion of the inner lead portion of the fourth lead and the resin injection trace in the first direction is smaller than a spacing between the portion of the inner lead portion of the fourth lead and the first chip mounting portion in the first direction, and in plan view, the portion of the inner lead portion of the fourth lead is located on a second virtual line passing through the resin injection trace and extending along the first side.

According to the above-described aspects of the present invention, reliability of the semiconductor device can be improved.

BRIEF DESCRIPTIONS OF THE DRAWINGS

DESCRIPTIONS OF THE PREFERRED EMBODIMENTS

Figure 1:
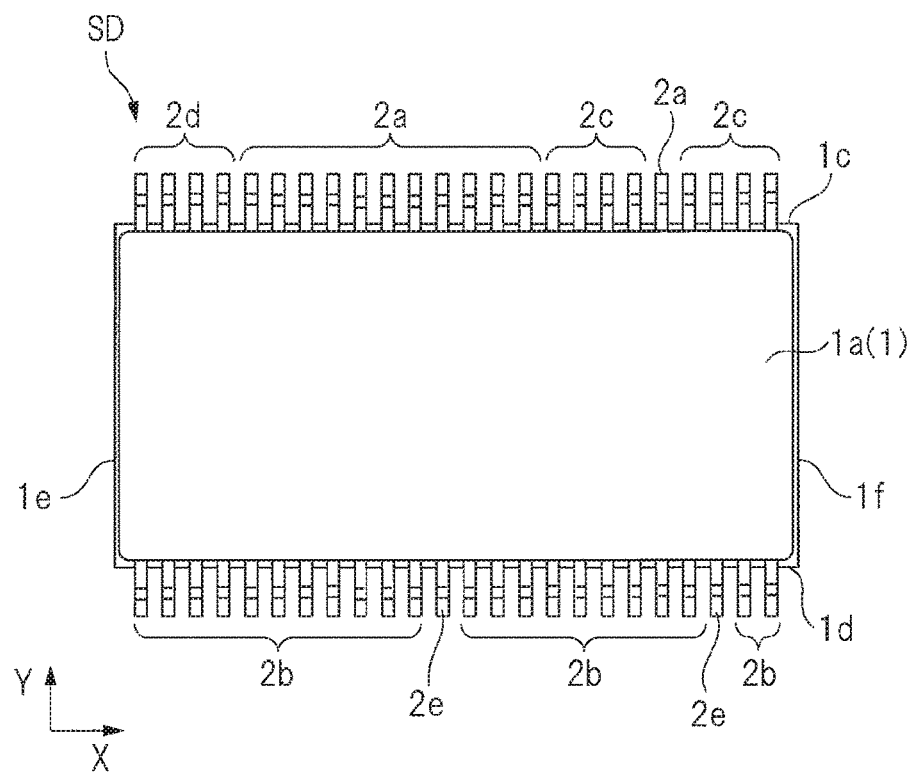
FIG. 1 is a plan view showing an external configuration of a semiconductor device according to an embodiment of the present invention.

In the embodiment described below, the invention will be described in a plurality of sections or embodiments if necessary for the sake of convenience. However, these sections or embodiments are not irrelevant to each other unless otherwise clearly specified, and one section or embodiment partially or entirely corresponds to another section or embodiment as a modification, detailed or supplementary description, or the like.

In addition, in the embodiment described below, when referring to the number of a component (including number of pieces, numerical value, amount, and range), the number is not limited to a specified number and may be less than or greater than this number, unless otherwise clearly specified or unless it is obvious from the context that the number is limited to the specified number in principle.

Additionally, in the embodiment described below, it goes without saying that each component (including an element step) is not indispensable unless otherwise clearly specified or unless it is obvious from the context that the component is indispensable in principle.

Likewise, in the embodiment described below, when referring to a shape, a positional relation, or the like of a component, a substantially approximate shape, a similar shape, or the like is included unless otherwise clearly specified or unless it is obvious from the context that the shape, the positional relation, or the like of the component differs in principle. The same applies to the above-described numerical value and range.

In addition, in all of the drawings that describe the embodiment, the same members are generally denoted by the same reference symbols, and redundant descriptions thereof are omitted as appropriate. Note that, in order to easily view the drawings, hatched lines or stippled dots are occasionally used even if the drawing is a plan view.

Embodiment

Description of Basic Terms

In the present specification, the term "semiconductor device" refers to a structure comprising a semiconductor component (such as a semiconductor chip) and an external connection terminal electrically connected with the semiconductor component, and refers to, for example, a structure in which the semiconductor component is covered by an encapsulation body. In particular, the "semiconductor device" is configured so as to be capable of being electrically connected with an external device via the external connection terminal.

Additionally, in the present specification, the term "power transistor" refers to a group of unit transistors (cell transistors) that are connected in parallel with one another (for example, thousands to hundreds of thousands of unit transistors that are connected in parallel with one another) in order to achieve a function of the unit transistor even at a current higher than the allowable current of the unit transistor. For example, if the unit transistor functions as a switching element, the "power transistor" serves as a switching element that can be used at a current higher than the allowable current of the unit transistor. In particular, in the present specification, the term "power transistor" is an expression used to describe a generic concept encompassing, for example, both a "power MOSFET" and an "IGBT". The term "micro-isolator" refers to a circuit comprising an insulating function and a signal transmitting function that utilizes a transformer formed on the semiconductor chip by using a wiring layer.

Description of Studied Example

Figure 24:
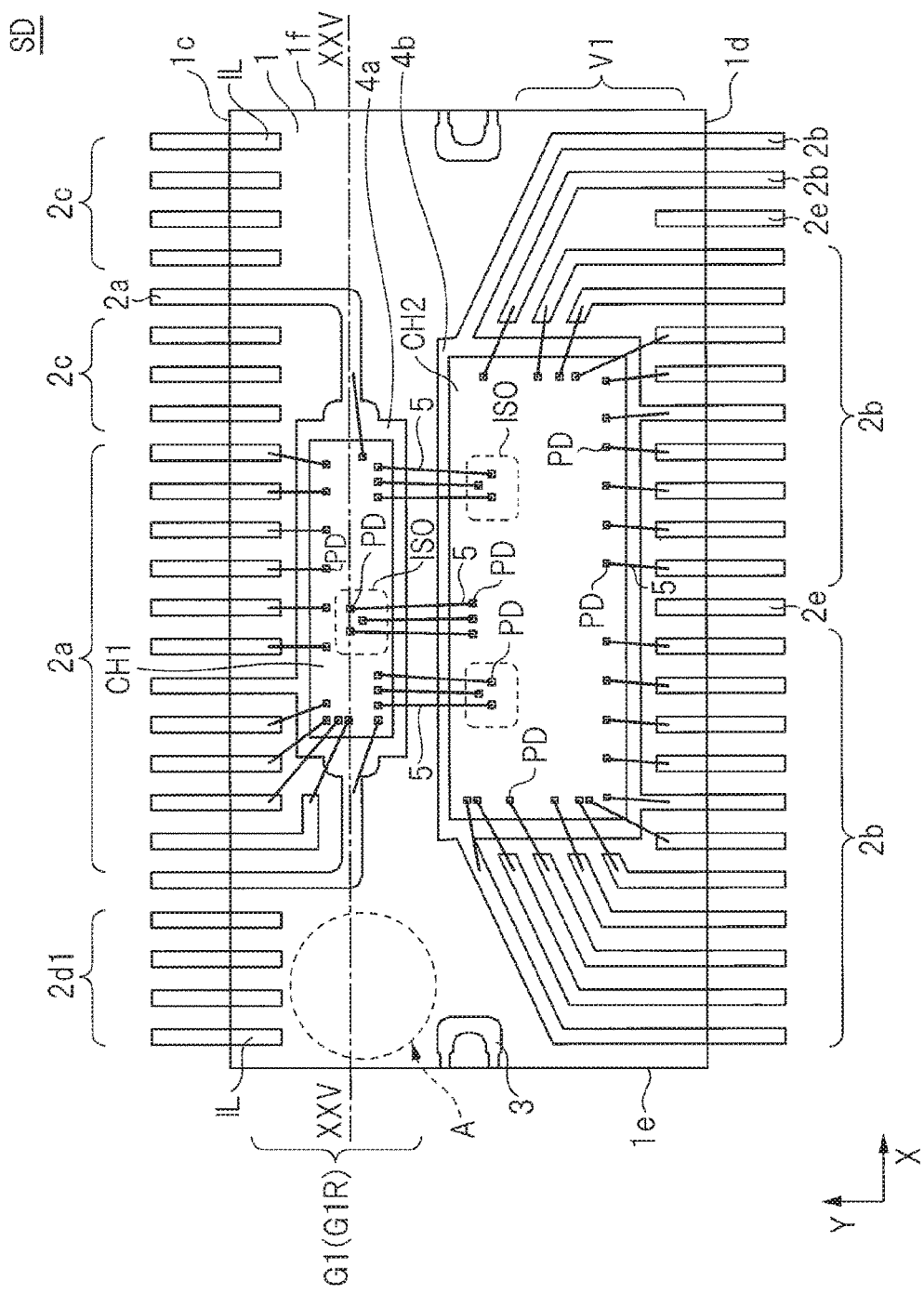
FIG. 24 is a perspective plan view of a semiconductor device according to a studied example.
Figure 25:
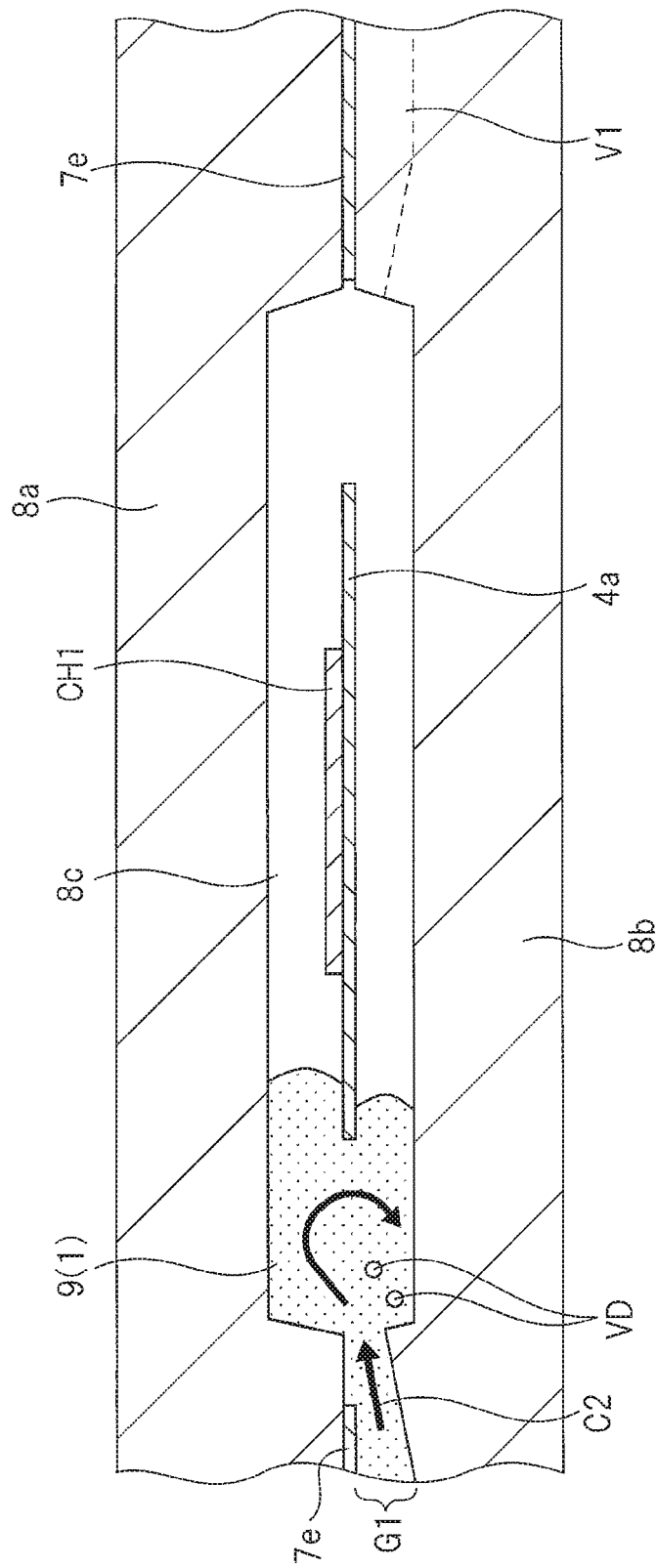
FIG. 25 is a cross-sectional view taken along a line XXV-XXV of FIG. 24.

First, an example not publicly known but studied by the inventors of the present application will be described. FIG. 24 is a perspective plan view of a semiconductor device SD according to the studied example. FIG. 25 is a cross-sectional view taken along a line XXV-XXV of FIG. 24. Note that FIG. 25 shows a resin-encapsulating (molding) process, in which a flow of resin 9 injected into a cavity 8c from a gate portion G1 is denoted by arrows C2.

The inventors of the present application have studied an SOP (Small Outline Package) type semiconductor device having two semiconductor chips with different maximum operating voltages that are encapsulated with resin. As shown in FIG. 24, this semiconductor device SD includes long sides 1c and 1d opposite to each other and short sides 1e and 1f opposite to each other on a main surface of an encapsulation body 1. Further, the semiconductor device SD includes a plurality of first leads on the long side 1c and a plurality of second leads on the long side 1d opposite to the long side 1c. A semiconductor chip CH1 having a relatively low maximum operating voltage is connected with the plurality of first leads arranged on the long side 1c, and a semiconductor chip CH2 having a relatively high maximum operating voltage is connected with the plurality of second leads arranged on the long side 1d. With such a configuration, a creepage distance between the first leads and the second leads can be maintained, thereby improving insulation and breakdown voltage between the first leads connected with the semiconductor chip CH1 and the second leads connected with the semiconductor chip CH2.

In addition, a micro-isolator ISO utilizing a pair of magnetic coils produced in the semiconductor manufacturing process is used for electrically connecting the semiconductor chip CH1 and the semiconductor chip CH2 having different maximum operation voltages.

Among the first leads shown in FIG. 24, leads 2a are leads connected with the semiconductor chip CH1, and leads 2c and 2d1 are leads not connected with the semiconductor chip CH1. In addition, among the second leads, leads 2b are leads connected with the semiconductor chip CH2, and leads 2e are leads not connected with the semiconductor chip CH2.

In the above-described semiconductor device SD, the number of leads 2b connected with the semiconductor chip CH2 (in other words, the number of pad electrodes PD of the semiconductor chip CH2 connected with the leads 2b) is relatively large, whereas the number of leads 2a connected with the semiconductor chip CH1 (in other words, the number of pad electrodes PD of the semiconductor chip CH1 connected with the leads 2a) is relatively small. However, from the viewpoint of stability or the like when mounting the semiconductor device SD on a mounting substrate or the like, the number of leads arranged on the long side 1c is usually equal to the number of leads arranged on the long side 1d. Namely, the first leads arranged on the long side 1c include several leads 2c and 2d1 not connected with the semiconductor chip CH1, and the number of leads 2c and 2d1 is greater than the number of leads 2e arranged on the long side 1d and not connected with the semiconductor chip CH2.

In addition, although the pad electrodes PD of the semiconductor chip CH1 and the leads 2a are connected to each other via wires 5, it is effective to shorten the lengths of the wires and the leads in order to increase the speed of the semiconductor device SD, and thus, the semiconductor chip CH1 is arranged at a center portion of the encapsulation body 1 in an extending direction of the long side 1c. Therefore, among the plurality of first leads arranged on the long side 1c, the plurality of leads 2a connected with the semiconductor chip CH1 are configured so as to be arranged at the center portion of the encapsulation body 1, and the plurality of leads 2c and 2d1 not connected with the semiconductor chip CH1 are configured so as to be respectively arranged at both sides of the center portion.

In the studied example as shown in FIG. 24, since an inner lead portion IL of each of the leads 2d1 close to the gate portion G1 is short, a gap portion A in which no lead is present is formed in the vicinity of the gate portion G1. Namely, a length of the inner lead portion IL of the lead 2d1 closest to the short side 1e and crossing over the long side 1c in plan view is equal to a length of an inner lead portion IL of the lead 2c closest to the short side 1f and crossing over the long side 1c in plan view. In addition, the length of the inner lead portion IL of each of the leads 2d1 in a Y direction is equal to a length of the inner lead portion IL of each of the leads 2a arranged so as to overlap (be opposite to) a die pad 4a (with the exception of the leads 2a integrally formed (connected) with the die pad 4a).

As shown in FIG. 25, the gate portion G1 is formed only on a lower mold 8b of a mold 8 and is not formed on an upper mold 8a. Resin 9 injected from the gate portion G1 provided on the lower mold 8b first flows toward the upper mold 8a and then returns toward the lower mold 8b, thereby generating a swirl of the resin 9 in the vicinity of the gate portion G1 as denoted by arrows C2. Therefore, the air present within a cavity 8c is taken into the resin 9 and forms air bubbles (voids) VD, and the resin 9 flows to a vent portion V1 side in this state, so that the air bubbles VD tend to remain within the encapsulation body 1. Namely, if the air bubbles remain between the die pad 4a and a die pad 4b in FIG. 24, breakdown voltage between the die pad 4a and the die pad 4b is decreased. In other words, since the die pad 4a is electrically connected with the semiconductor chip CH1 and the die pad 4b is electrically connected with the semiconductor chip CH2, breakdown voltage between the semiconductor chip CH1 and the semiconductor chip CH2 is decreased. In addition, if the air bubbles remain between the leads 2a, between the leads 2b, or between the wires 5, breakdown voltage therebetween is decreased.

In this manner, the inventors of the present application became aware of a problem in which the air bubbles (voids or holes) remain within the encapsulation body in the resin-encapsulating (molding) process of the semiconductor device, whereby reliability of the semiconductor device SD is decreased. In particular, the inventors of the present application became aware of a problem in which these air bubbles remaining between both semiconductor chips cause the dielectric breakdown voltage between both semiconductor chips to decrease, whereby reliability of the semiconductor device is decreased. The present embodiment intends to prevent the air bubbles from forming within the encapsulation body 1 or reduce the number of air bubbles taken into the encapsulation body 1, thereby improving reliability of the semiconductor device SD.

External Configuration of Semiconductor Device

Figure 2:
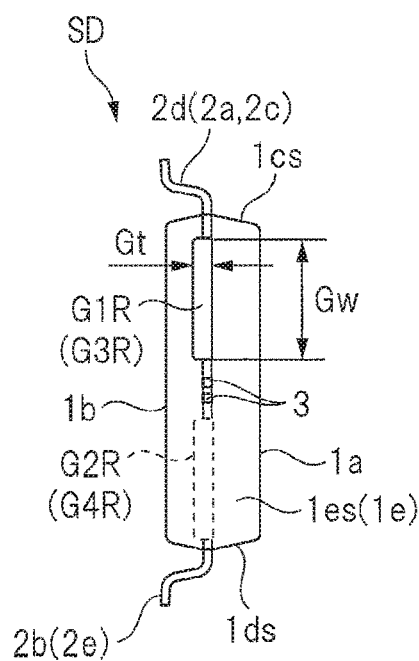
FIG. 2 is a side view showing another external configuration of the semiconductor device shown in FIG. 1.
Figure 3:
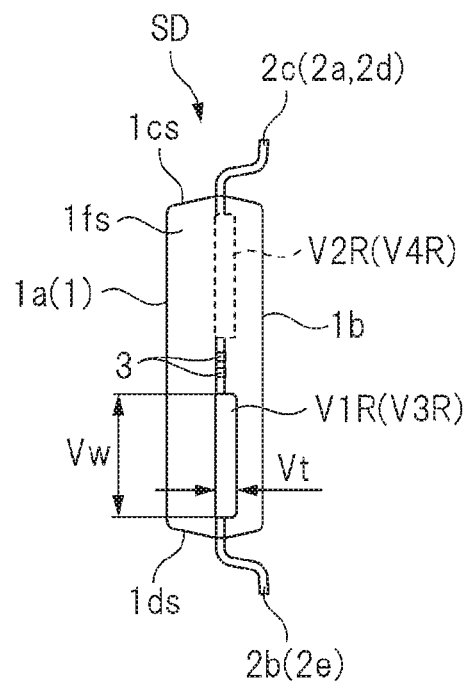
FIG. 3 is a side view showing another external configuration of the semiconductor device shown in FIG. 1.
Figure 4:
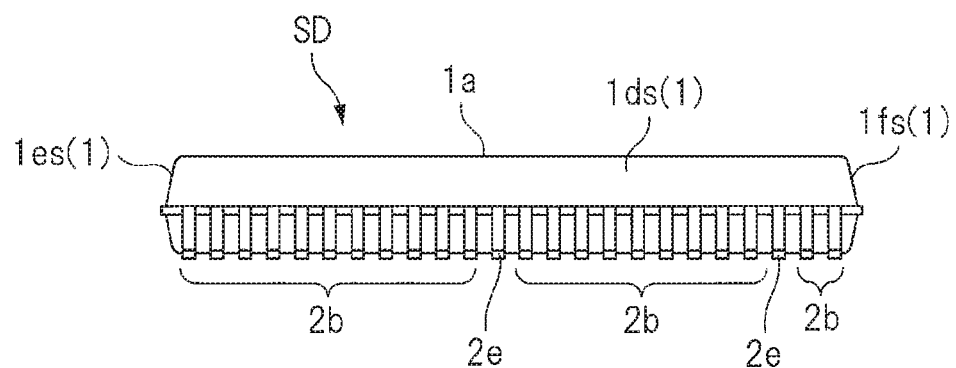
FIG. 4 is a side view showing another external configuration of the semiconductor device shown in FIG. 1.
Figure 5:
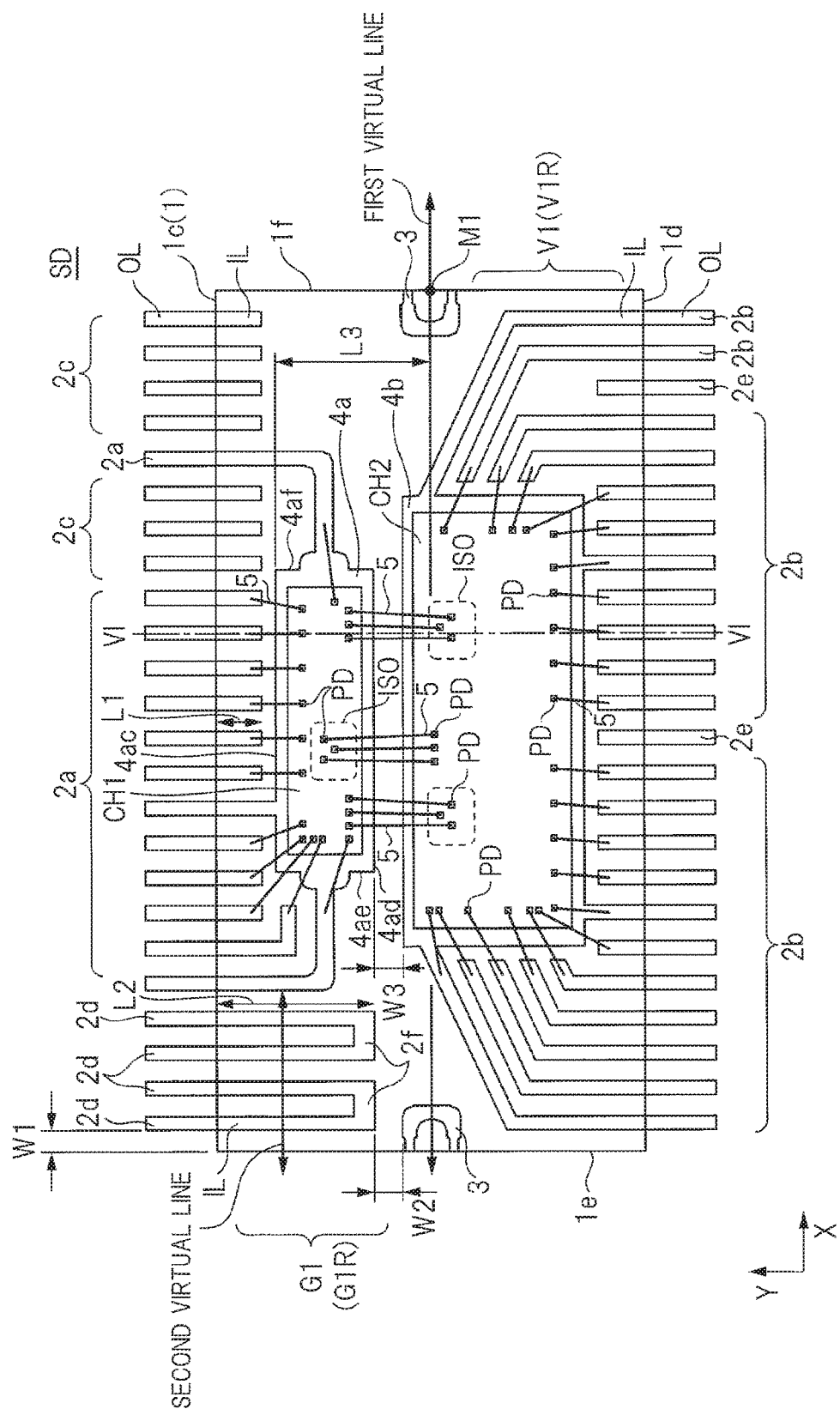
FIG. 5 is a plan view schematically showing an internal structure of the semiconductor device shown in FIG. 1.
Figure 6:
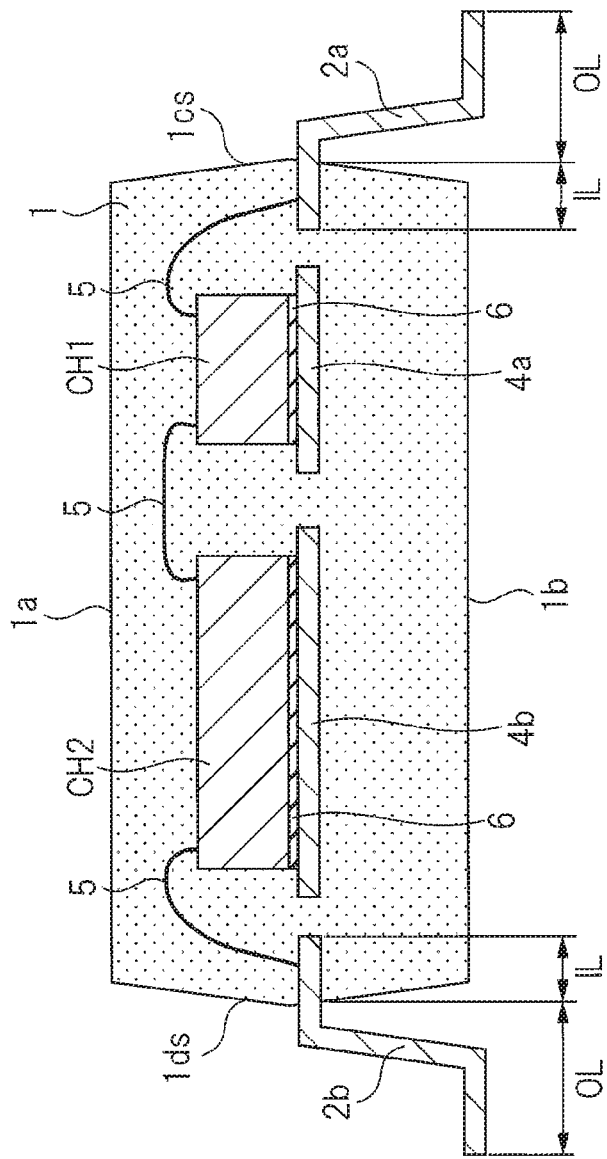
FIG. 6 is a cross-sectional view taken along a line VI-VI of FIG. 5.

FIG. 1 is a plan view showing an external configuration of a semiconductor device SD according to the present embodiment. FIGS. 2 to 4 are side views each showing an external configuration of the semiconductor device SD shown in FIG. 1. FIG. 5 is a plan view schematically showing an internal structure of the semiconductor device SD shown in FIG. 1. FIG. 6 is a cross-sectional view taken along a line VI-VI of FIG. 5.

The external configuration of the semiconductor device SD according to the present embodiment will be described with reference to FIGS. 1 to 4. As shown in FIG. 1, the semiconductor device SD includes an encapsulation body 1 and a plurality of leads 2a, 2b, 2c, 2d and 2e. The encapsulation body 1 includes a main surface 1a and a back surface 1b opposite to the main surface 1a. The main surface 1a includes one long side 1c, another long side 1d opposite to the long side 1c, one short side 1e, and another short side 1f opposite to the short side 1e. In addition, the encapsulation body 1 includes four side surfaces 1cs, 1ds, 1es and 1fs which attach the main surface 1a to the back surface 1b at the long sides 1c and 1d and short sides 1e and 1f.

As shown in FIG. 1, the plurality of leads 2a, 2c and 2d are arranged on the long side 1c of the encapsulation body 1 in plan view, and as shown in FIGS. 2 and 3, the plurality of leads 2a, 2c and 2d protrude to the outside of the encapsulation body 1 from the side surface 1cs in plan view. In addition, as shown in FIGS. 2 to 4, the plurality of leads 2b and 2e are arranged on the long side 1d in plan view, and the plurality of leads 2b and 2e protrude to the outside of the encapsulation body 1 from the side surface 1ds in plan view. The leads protruding from the long side 1c are referred to as first leads as a whole, and the leads protruding from the long side 1d are referred to as second leads as a whole. The first leads comprise the plurality of leads 2a, 2c and 2d, and the second leads comprise the plurality of leads 2b and 2e. Further, the number of first leads is equal to the number of second leads. In addition, as shown in FIG. 5 or 6, the plurality of leads 2a, 2c and 2d and the plurality of leads 2b and 2e each comprise an inner lead portion IL located within the encapsulation body 1 and an outer lead portion OL located outside the encapsulation body 1. Additionally, the outer lead portion OL of each of the leads 2a, 2c and 2d protruding from the long side 1c has the same width as one another in the X direction, is arranged so as to be equally spaced from one another in the X direction, and has the same length as one another in the Y direction. The outer lead portion OL of each of the leads 2b and 2e protruding from the long side 1d has the same width as one another in the X direction, is arranged so as to be equally spaced from one another in the X direction, and has the same length as one another in the Y direction. Furthermore, the width, the spacing therebetween, and the length of the outer lead portion OL of each of the leads 2a, 2c and 2d protruding from the long side 1c are respectively equal to the width, the spacing therebetween, and the length of the outer lead portion OL of each of the leads 2b and 2e protruding from the long side 1d.

As shown in FIG. 2 or 3, a suspension lead 3 is arranged at a center portion of each of the side surfaces 1es and 1fs. As shown in FIG. 2, a resin injection trace G1R (G3R) is present between the suspension lead 3 and the side surface 1cs, and as shown in FIG. 3, a resin discharge trace V1R (V3R) is present between another suspension lead 3 and the side surface 1ds. As denoted by broken lines in FIG. 2, a resin injection trace G2R (G4R) is present between another suspension lead 3 and the side surface 1ds, and as denoted by broken lines in FIG. 3, a resin discharge trace V2R (V4R) is present between another suspension lead 3 and the side surface 1cs.

Figure 11:
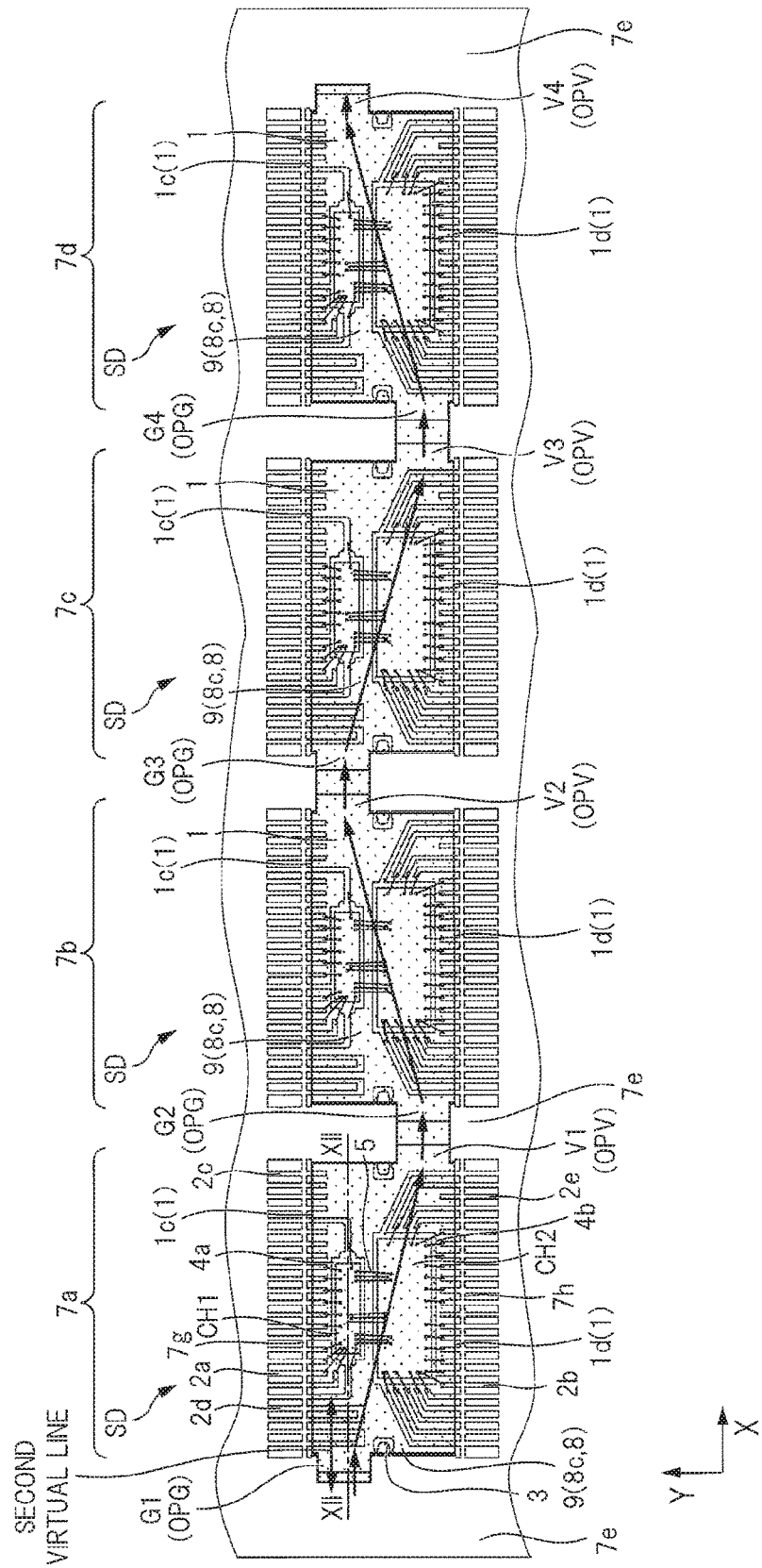
FIG. 11 is another plan view showing the semiconductor device according to the present embodiment in the manufacturing process.

The resin injection traces G1R, G2R, G3R and G4R shown in FIG. 11 are traces formed by respectively separating the resin remaining within gate portions G1, G2, G3 and G4 from the encapsulation body 1 in a molding process. In addition, the resin discharge traces V1R, V2R, V3R and V4R shown in FIG. 11 are traces formed by respectively separating the resin remaining within vent portions V1, V2, V3 and V4 from the encapsulation body 1 in the molding process. The resin injection traces G1R, G2R, G3R and G4R are formed on the side surface 1es along the short side 1e, and the resin discharge traces V1R, V2R, V3R and V4R are formed on the side surface 1fs along the short side 1f. Here, the resin injection trace G1R (G3R) and the resin discharge trace V1R (V3R) denoted by solid lines in FIGS. 2 and 3 are present within the semiconductor device SD corresponding to a product forming region 7a (7c) shown in FIG. 11, and the resin injection trace G2R (G4R) and the resin discharge trace V2R (V4R) denoted by broken lines in FIGS. 2 and 3 are present within the semiconductor device SD corresponding to a product forming region 7b (7d) shown in FIG. 11. Although positions of the resin injection traces and the resin discharge traces of the semiconductor device SD within the product forming region 7a (7c) and the semiconductor device SD within the product forming region 7b (7d) differ from each other, other portions of the product forming regions are the same. As shown in FIG. 2, the resin injection trace G1R (G3R) has a width Gw in an extending direction of the short side 1e and a thickness Gt in a direction from the main surface 1a to the back surface 1b. Likewise, the resin injection trace G2R (G4R) has a width Gw and a thickness Gt. In addition, the resin discharge trace V1R (V3R) has a width Vw in an extending direction of the short side 1f and a thickness Vt in the direction from the main surface 1a to the back surface 1b. Likewise, the resin discharge trace V2R (V4R) has a width Vw and a thickness Vt.

In addition, as shown in FIG. 5 or 6, the semiconductor device SD includes two semiconductor chips CH1 and CH2. Although not denoted by reference symbols, the surface of each of the semiconductor chips CH1 and CH2, each of the leads 2a to 2e, and each of the die pads 4a and 4b on the same side as the main surface 1a of the encapsulation body 1 is referred to as a main surface thereof, and the surface of each of the semiconductor chips CH1 and CH2, each of the leads 2a to 2e, and each of the die pads 4a and 4b on the same side as the back surface 1b is referred to as a back surface thereof. The semiconductor chip CH1 is smaller than the semiconductor chip CH2 in plan view. Namely, the main surface of each of the semiconductor chips CH1 and CH2 has a rectangular shape, and the semiconductor chip CH1 is smaller than the semiconductor chip CH2 in the longitudinal direction (X direction of FIG. 5) and the lateral direction (Y direction of FIG. 5).

The semiconductor chip CH1 is mounted on the main surface of the die pad (chip mounting portion) 4a, and the semiconductor chip CH2 is mounted on the main surface of the die pad (chip mounting portion) 4b. The semiconductor chip CH1 is adhered to the die pad 4a via an adhesive layer 6, and the semiconductor chip CH2 is adhered to the die pad 4b via another adhesive layer 6. In plan view, the die pads 4a and 4b are respectively larger in size than the semiconductor chips CH1 and CH2, and the semiconductor chips CH1 and CH2 are respectively located within regions of the die pads 4a and 4b and do not extend to the outside of the die pads 4a and 4b. In addition, the die pad 4a is connected with three leads 2a protruding from the long side 1c of the encapsulation body 1, and the die pad 4b is connected with four leads 2b protruding from the long side 1d of the encapsulation body 1. In other words, the die pad 4a is configured so as to be integral with the three leads 2a protruding from the long side 1c of the encapsulation body 1, and the die pad 4b is configured so as to be integral with the four leads 2b protruding from the long side 1d of the encapsulation body 1.

A plurality of MISFETs (Metal Insulator Semiconductor Field Effect Transistors) and at least one micro-isolator ISO are formed on the main surface of each of the semiconductor chips CH1 and CH2 and configure circuit blocks BLK1 and BLK2 described below. Additionally, a plurality of pad electrodes (bonding pads, chip terminals) PD are formed on the main surface of each of the semiconductor chips CH1 and CH2. The pad electrodes PD are input/output terminals for the semiconductor chips CH1 and CH2. The number of pad electrodes PD formed on the main surface of the semiconductor chip CH1 is less than the number of pad electrodes PD formed on the main surface of the semiconductor chip CH2. Further, the number of pad electrodes PD on the semiconductor chip CH1 connected with the leads 2a is less than the number of pad electrodes PD on the semiconductor chip CH2 connected with the leads 2b. Namely, the semiconductor chip CH1 is smaller than the semiconductor chip CH2, and a plane area of the main surface of the semiconductor chip CH1 is less than a plane area of the main surface of the semiconductor chip CH2.

The plurality of pad electrodes PD on the semiconductor chip CH1 are connected with the plurality of leads 2a protruding from the long side 1c of the encapsulation body 1 via the wires 5. The plurality of leads 2a connected with the semiconductor chip CH1 and the plurality of leads 2c and 2d not connected with the semiconductor chip CH1 are arranged on the long side 1c of the encapsulation body 1. Namely, the wires 5 used for the connection with the semiconductor chip CH1 are not connected with the leads 2c and 2d. In other words, the leads 2c and 2d are electrically floating and are electrically isolated from the semiconductor chip CH1.

As shown in FIG. 5, the plurality of leads 2a, 2c and 2d are arranged along the long side 1c of the encapsulation body 1. The plurality of leads 2a, 2c and 2d each include the inner lead portion IL covered by the encapsulation body 1 and the outer lead portion OL extending outside of the encapsulation body. The plurality of leads 2a are each arranged at a center portion of the long side 1c in the X direction, and the plurality of leads 2c and 2d are respectively arranged at both sides of the center portion. The inner lead portion IL of some of the leads 2a is located between the long side 1c of the encapsulation body 1 and the die pad 4a in the Y direction. The inner lead portion IL of each of the leads 2c and 2d is not located between the long side 1c of the encapsulation body 1 and the die pad 4a in the Y direction. The die pad 4a includes a long side 4ac extending along the long side 1c of the encapsulation body 1, a long side 4ad opposite to the long side 4ac and extending along the long side 1d of the encapsulation body 1, a short side 4ae extending along the short side 1e of the encapsulation body 1, and a short side 4af opposite to the short side 4ae and extending along the short side 1f of the encapsulation body 1. Here, the long side 4ac of the die pad 4a is located between the long side 1c of the encapsulation body 1 and the long side 4ad of the die pad 4a. Additionally, when a first virtual line is defined by a line passing through a midpoint M1 between the long side 1c the encapsulation body 1 and the long side 1d the encapsulation body 1 in the Y direction (or the midpoint of short side 1e or 1f) and extending in the X direction, a distance L3 from the first virtual line to the long side 4ac of the die pad 4a in the Y direction is greater than a length L1 of the inner lead portion IL of some of the leads 2a in the Y direction. A length L2 of the inner lead portion IL of each of the leads 2d in the Y direction is greater than the length L1 of the inner lead portion IL of some of the leads 2a in the Y direction. The resin injection trace G1R at the short side 1e of the encapsulation body 1 is located closer to the long side 1c of the encapsulation body 1 than to the long side 1d of the encapsulation body 1. A portion of the inner lead portion IL of each of the leads 2d is located between the die pad 4a and the resin injection trace G1R. The portion of the inner lead portion IL of each of the leads 2d is located on a second virtual line passing through the resin injection trace G1R and extending along the long side 1c of the encapsulation body 1. Note that the above-described second virtual line overlaps the flow of resin 9 denoted by arrows C1 in the molding process described below.

In the present embodiment, although four leads 2d are provided between the plurality of leads 2a and the short side 1e, it is only necessary to provide at least one lead 2d. Namely, a length of a portion extending along the Y direction (or extending along the short side 1e) of the inner lead portion IL of the lead 2d crossing over the long side 1c and closest to the short side 1e on which the resin injection trace G1R is located is greater than a length of a portion extending along the Y direction (or extending along the short side 1f) of the inner lead portion IL of the lead 2c crossing over the long side 1c and closest to the short side 1f on which the resin discharge trace V1R is located. Note that the inner lead portion IL of some of the leads 2b is located between the long side 1d of the encapsulation body 1 and the die pad 4b in the Y direction. The inner lead portion IL of one of the leads 2e is not located between the long side 1d of the encapsulation body 1 and the die pad 4b in the Y direction.

In addition, the length L2 of the inner lead portion IL of each of the leads 2d in the Y direction is greater than the distance L3 from the first virtual line to the long side 4ac of the die pad 4a in the Y direction.

In addition, a length of a portion extending in the Y direction of the inner lead portion IL of each of the leads 2a arranged so as to overlap the die pad 4a in the Y direction (with the exception of the leads 2a connected with the die pad 4a) is equal to the length of the portion extending in the Y direction of the inner lead portion IL of each of the leads 2c. Namely, the length of the portion extending in the Y direction of the inner lead portion IL of each of the leads 2d is greater than a length of a portion extending in the Y direction of the inner lead portion IL of each of the leads 2a arranged so as to overlap the die pad 4a (with the exception of the leads 2a connected with the die pad 4a). In addition, a spacing between the resin injection trace G1R and each of the leads 2d in the X direction is smaller than a spacing between the die pad 4a and the same lead 2d in the X direction.

In this manner, by setting the inner lead portion IL (in particular, the portion extending in the Y direction) of each of the leads 2d to be longer than the inner lead portion IL (in particular, the portion extending in the Y direction) of each of the leads 2c, the air bubbles (voids) can be prevented from forming within the encapsulation body 1 in the molding process described below. In addition, by setting the inner lead portion IL (in particular, the portion extending in the Y direction) of each of the leads 2c to be shorter than the inner lead portion IL (in particular, the portion extending in the Y direction) of the leads 2d, the air bubbles (voids) can be prevented from remaining within the encapsulation body 1. Details will be described below.

In addition, the two leads 2d adjacent to each other in the X direction (extending directions of the long sides 1c and 1d) have tip ends (end portions closer to the long side 1d) that are coupled to each other by a coupling portion 2f. As shown in FIG. 5, two pairs of leads 2d coupled to each other at each tip end by the coupling portion 2f are arranged between the leads 2a and the short side 1e. By coupling the tip end of each of the leads 2d to each other, occurrence of warpage at the tip end of each of the leads 2d can be reduced, and thus, workability in the forming process of the semiconductor device SD can be improved. Namely, if warpage occurs at the tip end of each of the leads 2d when the lead frame is being transported, the lead frame may be caught by another lead frame and may cause the leads 2a, 2b, 2c, 2d and 2e to deform. By coupling the tip end of each of the leads 2d to each other, it is possible to prevent deformation of the leads 2a, 2b, 2c, 2d and 2e. Additionally, since the resin is filled between the two leads 2d coupled by the coupling portion 2f, it is possible to prevent interface delamination between the resin that configures the encapsulation body 1 and the leads 2a to 2e.

In addition, a distance W1 between the short side 1e on which the resin injection trace G1R is located and the lead 2d closest to the short side 1e is preferably greater than or equal to the thickness Gt of the resin injection trace G1R shown in FIG. 2 (W1≥Gt). By satisfying such a relation, it is possible to prevent chipping of the encapsulation body 1 that occurs when separating the resin remaining within the gate portion G1 from the encapsulation body 1 in the molding process described below.

In addition, as shown in FIG. 5, it is preferable that a distance (separation distance) W2 between the plurality of leads 2d and the suspension lead 3 in the Y direction is greater than or equal to a distance (separation distance) W3 between the die pad 4a and the die pad 4b (W2≧W3). If the distance W2 is set to be less than the distance W3, insulation of the leads 2d and the suspension lead 3 cannot be maintained, and a creepage distance between the plurality of leads 2a, 2c and 2d and the plurality of leads 2b and 2e would be reduced to approximately one-half of the distance shown in FIG. 5 which is approximately equal to the length of the short side 1e of the encapsulation body 1 in plan view. Therefore, the breakdown voltage properties between the leads 2a, 2c and 2d protruding from the long side 1c and the leads 2b and 2e protruding from the long side 1d are decreased.

In addition, the pad electrodes PD on the semiconductor chip CH2 are connected with the leads 2b crossing over the long side 1d of the encapsulation body 1 via the plurality of wires 5. The plurality of leads 2b connected with the semiconductor chip CH2 and the two leads 2e not connected with the semiconductor chip CH2 are arranged on the long side 1d of the encapsulation body 1. The leads 2e are not electrically connected with the semiconductor chip CH2 and are electrically isolated from the semiconductor chip CH2. The leads 2e are electrically floating. Namely, the majority of leads arranged on the long side 1d are connected with the semiconductor chip CH2.

In addition, although not shown in FIG. 5, the separation distance between the suspension lead 3 and the lead 2b closest to this suspension lead 3 is greater than or equal to the above-described distance W3.

In addition, as shown in FIG. 5, the semiconductor chip CH1 and the semiconductor chip CH2 are connected to each other via the wires 5 and the micro-isolators ISO. At least one of the micro-isolators ISO is formed within the semiconductor chip CH1 or CH2. For example, if at least one of the micro-isolators ISO is formed within the semiconductor chip CH1, an output signal of the semiconductor chip CH1 is transmitted to the semiconductor chip CH2 via a path of, for example: the micro-isolator ISO of the semiconductor chip CH1—the pad electrodes PD of the semiconductor chip CH1—the wires 5—the pad electrodes PD of the semiconductor chip CH2—the semiconductor chip CH2. In addition, if at least one of the micro-isolators ISO is formed within the semiconductor chip CH2, an output signal of the semiconductor chip CH1 is transmitted to the semiconductor chip CH2 via a path of, for example: the semiconductor chip CH1—the pad electrodes PD of the semiconductor chip CH1—the wires 5—the pad electrodes PD of the semiconductor chip CH2—the micro-isolator ISO of the semiconductor chip CH2—the semiconductor chip CH2.

In addition, as shown in FIG. 5, the rectangular semiconductor chips CH1 and CH2 are arranged such that the long sides thereof extend along (in parallel with) the long sides 1c and 1d of the encapsulation body 1 and the short sides thereof extend along (in parallel with) the short sides 1e and 1f of the encapsulation body 1 in plan view. The semiconductor chips CH1 and CH2 are arranged apart from each other in the Y direction without overlapping each other in plan view. Namely, the semiconductor chip CH1 is arranged closer to the long side 1c than to the long side 1d in the Y direction, and the semiconductor chip CH2 is arranged closer to the long side 1d than to the long side 1c in the Y direction.

The semiconductor chips CH1 and CH2 are each arranged at a center portion of the encapsulation body 1 in the X direction in plan view. Namely, the semiconductor chip CH1 is arranged so as to overlap the semiconductor chip CH2 in the Y direction. In other words, the semiconductor chip CH1 is arranged so as to be sandwiched between the opposing short sides of the semiconductor chip CH2 in the X direction.

By arranging the semiconductor chip CH2 at the center portion of the encapsulation body 1 in the X direction, the plurality of leads 2b connected with the semiconductor chip CH2 can be radially arranged from the semiconductor chip CH2. Therefore, the length of the plurality of leads 2b connected with the semiconductor chip CH2 and the length of the wires 5 connecting the pad electrodes PD of the semiconductor chip CH2 and the leads 2b to each other can be shortened.

In addition, by arranging the semiconductor chips CH1 and CH2 so as to overlap each other in the Y direction, the length of each of the wires 5 connecting the semiconductor chips CH1 and CH2 to each other can be shortened.

Circuit Configuration of Semiconductor Device

Figure 7:
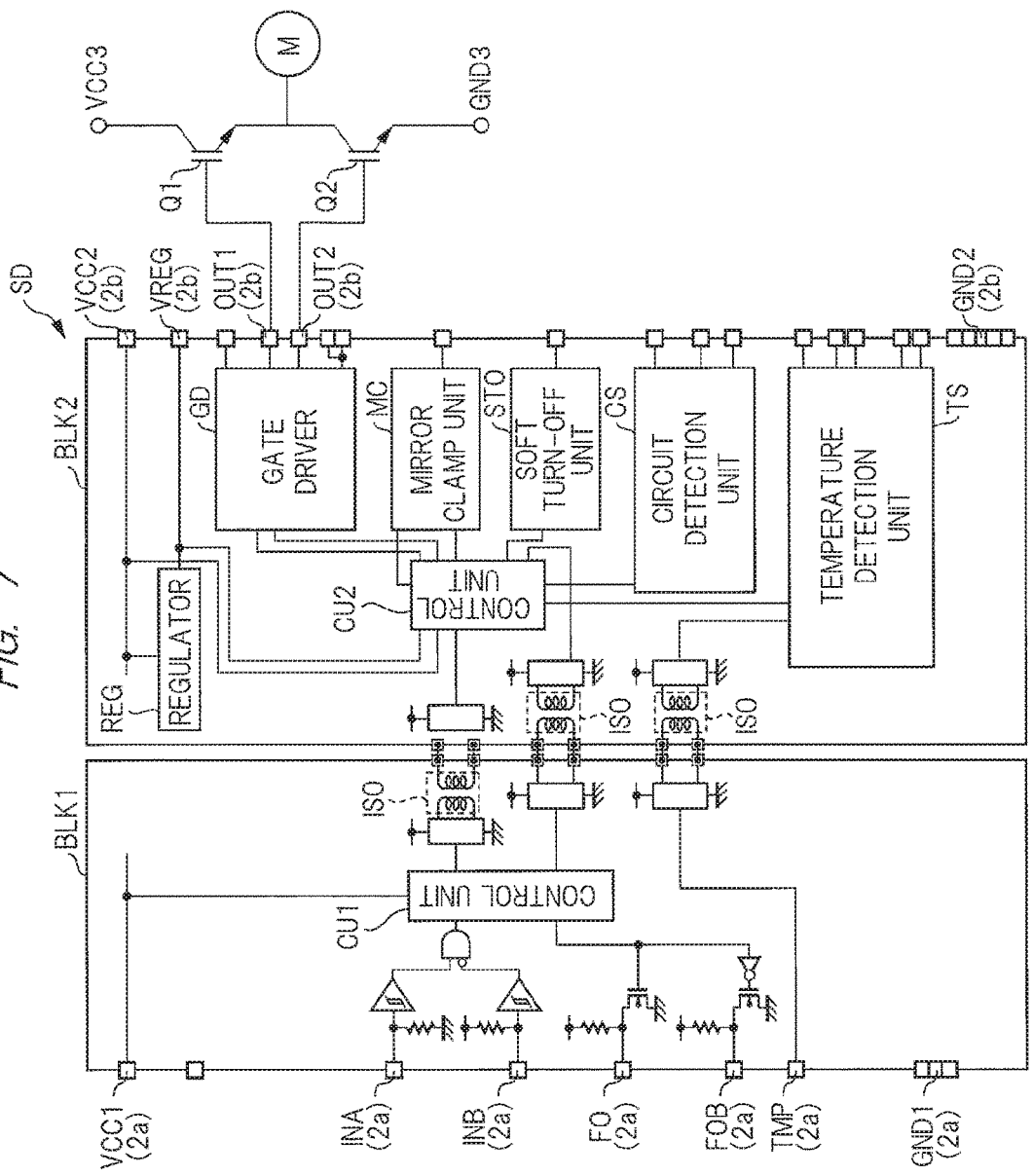
FIG. 7 is a block diagram schematically showing a circuit configuration of the semiconductor device according to the present embodiment.

Next, a circuit configuration formed within the semiconductor device SD according to the present embodiment will be described. FIG. 7 is a block diagram schematically showing the circuit configuration of the semiconductor device SD according to the present embodiment. In FIG. 7, the semiconductor device SD according to the present embodiment includes the circuit block BLK1 and the circuit block BLK2. The circuit block BLK1 corresponds to the semiconductor chip CH1 shown in FIG. 5, and the circuit block BLK2 corresponds to the semiconductor chip CH2 shown in FIG. 5. The circuit block BLK1 and the circuit block BLK2 are connected to each other via the micro-isolators ISO capable of transmitting electric signals in a non-contacting manner. At this time, for example, a support IC (Integrated Circuit) for assisting a microcomputer that assumes comprehensive control is formed within the circuit block BLK1, and a pre-driver IC for controlling switching operations of a power transistor (external semiconductor device) to be a component of an inverter based on, for example, an instruction from the support IC is formed within the circuit block BLK2. In particular, in the present embodiment, an IGBT (Insulated Gate Bipolar Transistor) is regarded as an example of the power transistor (switching element). For example, the semiconductor device SD is used for a drive control of an electric motor installed in an electric vehicle, a hybrid vehicle, or the like. Namely, the semiconductor device SD according to the present embodiment has a control function of the power transistor that configures the inverter controlling a rotation of the electric motor, as well as a relay function between the inverter and the microcomputer (ECU) that comprehensively controls the entire vehicle. Specifically, in FIG. 7, the relay function between the microcomputer and the pre-driver IC is achieved by the support IC formed within the circuit block BLK1, and the switching operation for the power transistor included within the external semiconductor device is achieved by the pre-driver IC formed within the circuit block BLK2. Namely, power transistors Q1 and Q2 connected in series between a terminal VCC3 and a terminal GND3 are connected with the circuit block BLK2, and the power transistors Q1 and Q are connected with the electric motor M as shown in FIG. 7. The circuit block BLK2 of the semiconductor device SD controls the switching operation of the power transistors Q1 and Q2. Incidentally, a power-supply potential supplied to the terminal VCC3 is several hundred volts or more, and a ground potential (reference potential) is supplied to the terminal GND3.

First, the circuit configuration of the circuit block BLK1 will be described. In FIG. 7, the circuit block BLK1 includes a control unit CU1 that functions as a central processing unit (MCU), and the power-supply potential is supplied from, for example, the terminal VCC1 to the control unit CU1. For example, the power-supply potential supplied from the terminal VCC1 to the control unit CU1 is 3.3 V or 5 V. On the other hand, the ground potential (reference potential) is supplied from a terminal GND1 to internal circuits within the circuit block BLK1.

The circuit block BLK1 includes terminals VCC1, INA, INB, FO, FOB, TMP and GND1 that correspond to the leads 2a of FIG. 5. In addition, the circuit block BLK1 further includes the control unit CU1, the micro-isolator ISO, and the like. The circuit block BLK2 includes terminals VCC2, VREG, OUT1, OUT2 and GND2 and other components that correspond to the leads 2b of FIG. 5. In addition, the circuit block BLK2 further includes a control unit CU2, a gate driver GD, the micro-isolators ISO and the like.

Gate drive signals are inputted to the terminals INA and INB of the circuit block BLK1, and the externally-connected power transistors Q1 and Q2 are controlled based on these gate drive signals. Namely, based on the gate drive signals inputted to the terminal INA and the terminal INB of the circuit block BLK1, the control unit CU1 of the circuit block BLK1 outputs control signals related to the switching controls of the power transistors Q1 and Q2 to the control unit CU2 of the circuit block BLK2 via the micro-isolators ISO. Thereafter, the control unit CU2 of the circuit block BLK2 controls the gate driver GD based on these control signals. As a result, the gate driver GD finally performs an ON/OFF operation (switching operation) of the power transistors Q1 and Q2 based on an instruction from the control unit CU2.

Since the semiconductor device SD of the present embodiment has the circuit configuration shown in FIG. 7, a maximum operating voltage applied to the semiconductor chip CH1 side (circuit block BLK1 side of FIG. 7) is a few volts, whereas a maximum operating voltage applied to the semiconductor chip CH2 side (circuit block BLK2 side of FIG. 7) is several hundreds to several thousands of volts. Taking this into consideration, the micro-isolators ISO that utilize electromagnetic induction coupling between inductors are adopted for the electrical connection between the semiconductor chip CH1 and the semiconductor chip CH2. Additionally, in the present embodiment, since it is necessary to maintain breakdown voltage between the leads 2a electrically connected with the semiconductor chip CH1 and the leads 2b electrically connected with the semiconductor chip CH2, the so-called SOP structure in which the plurality of leads 2a, 2c and 2d and the plurality of leads 2b and 2e are arranged so as to be opposite to each other is adopted as shown in FIGS. 1 and 5. In the present embodiment, in order to provide the semiconductor device SD that can be used at the maximum operating voltage of 400 Vrms, the creepage distance of 6.3 mm or more is maintained between the plurality of leads 2a, 2c and 2d and the plurality of leads 2b and 2e.

Manufacturing Method of Semiconductor Device

Figure 8:
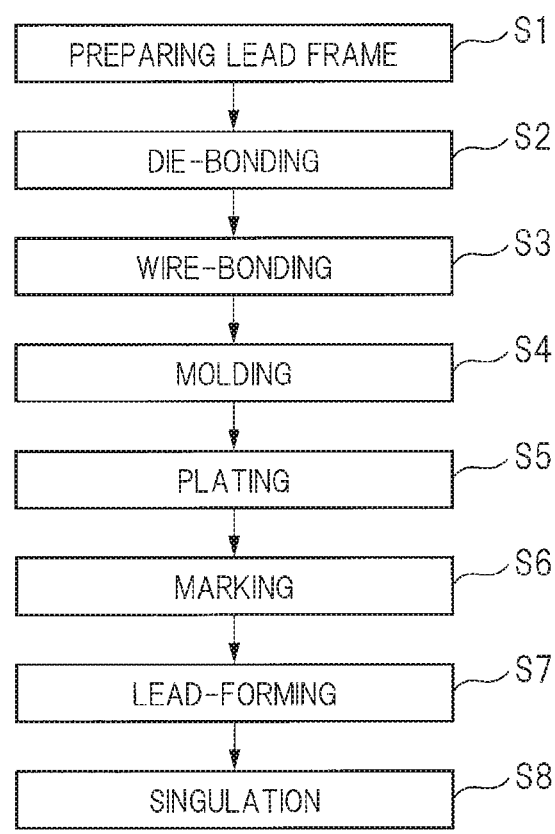
FIG. 8 is a process flowchart showing a manufacturing process of the semiconductor device according to the present embodiment.
Figure 9:
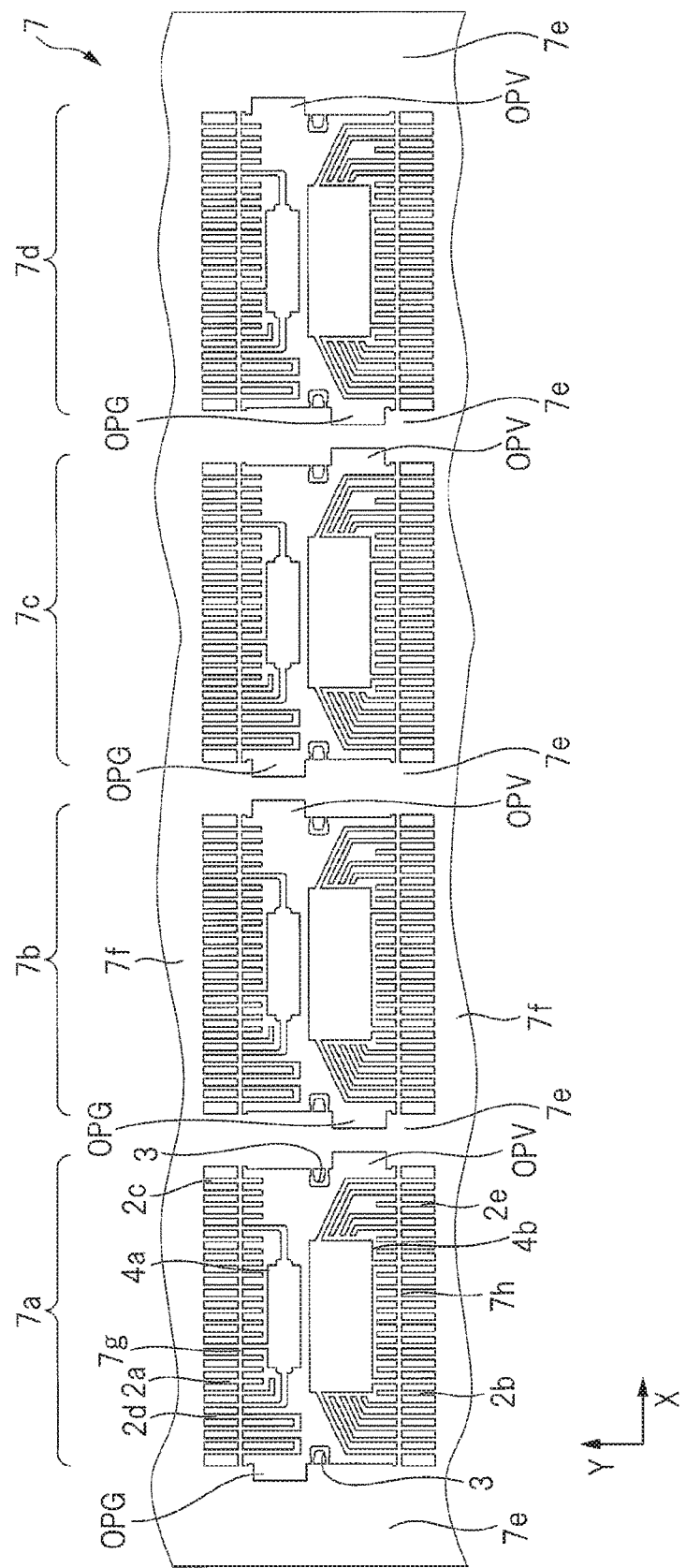
FIG. 9 is a plan view showing the semiconductor device according to the present embodiment in the manufacturing process.
Figure 10:
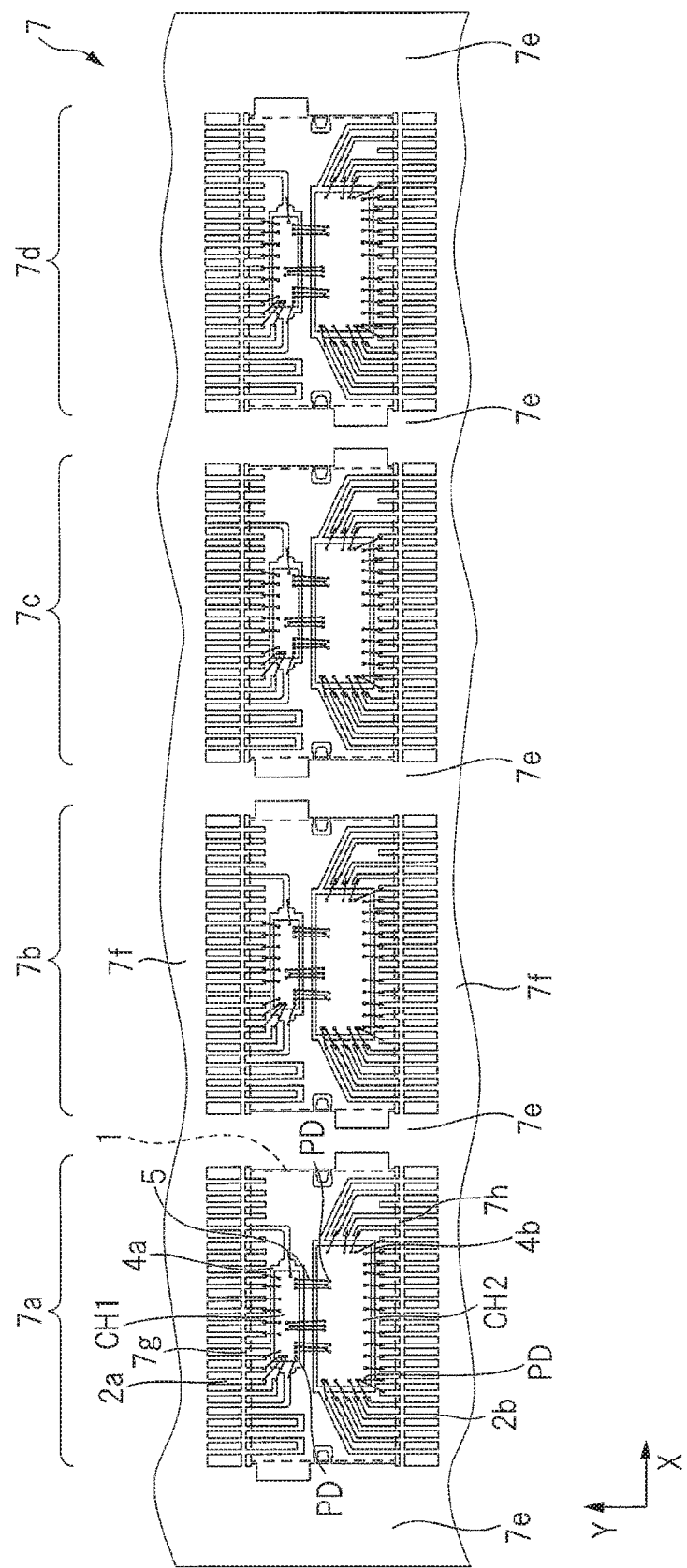
FIG. 10 is another plan view showing the semiconductor device according to the present embodiment in the manufacturing process.
Figure 12:
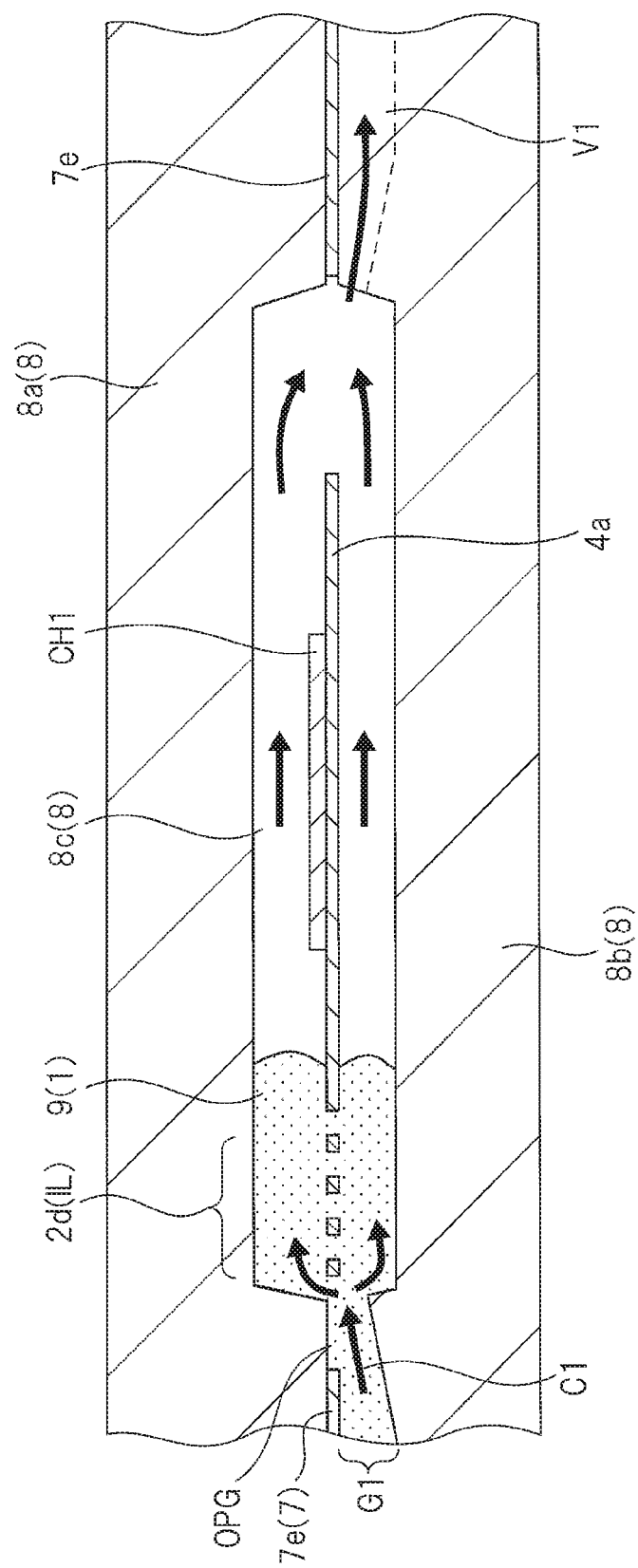
FIG. 12 is a cross-sectional view taken along a line XII-XII of FIG. 11.
Figure 13:
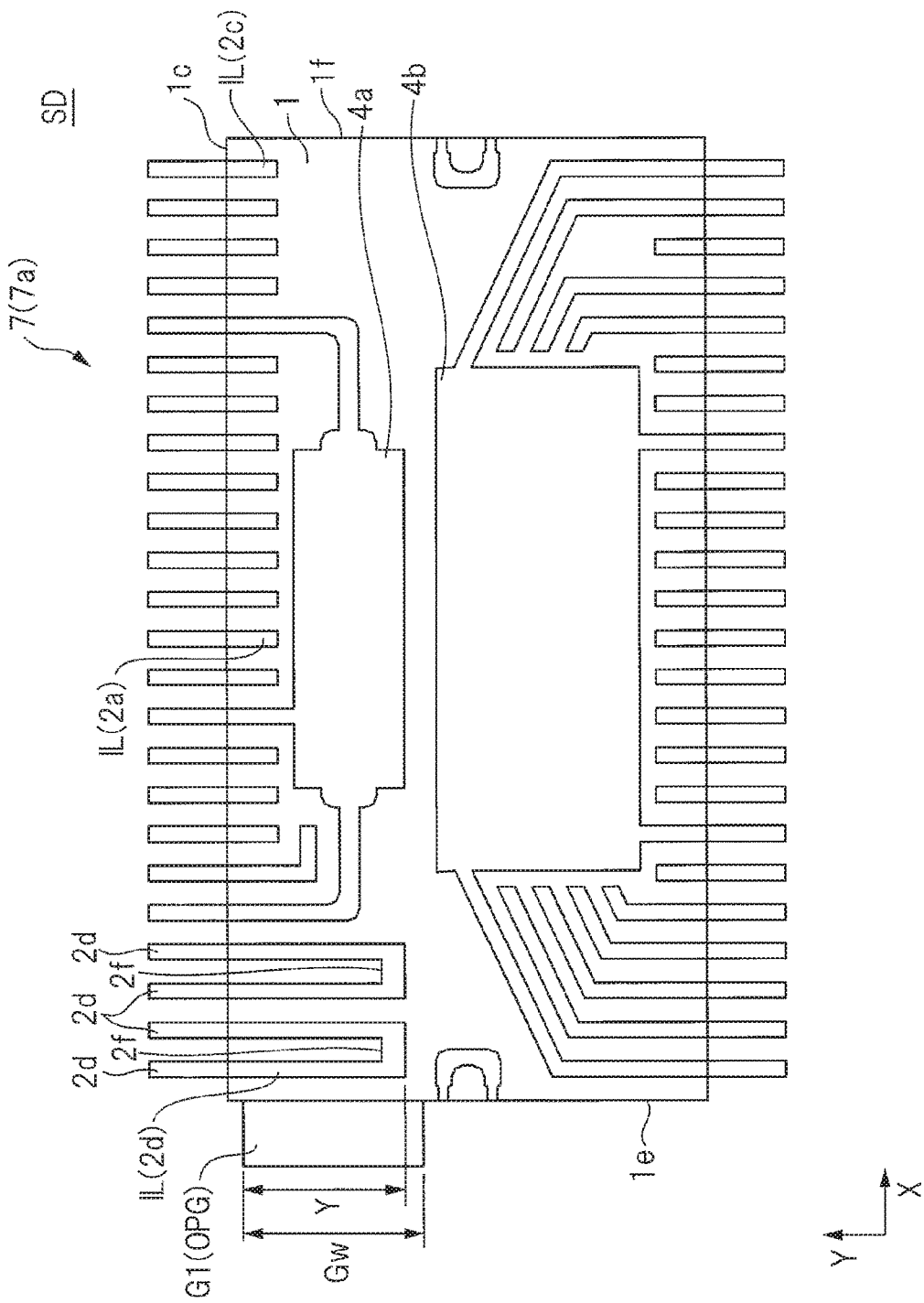
FIG. 13 is a perspective plan view showing the semiconductor device according to the present embodiment.
Figure 14:
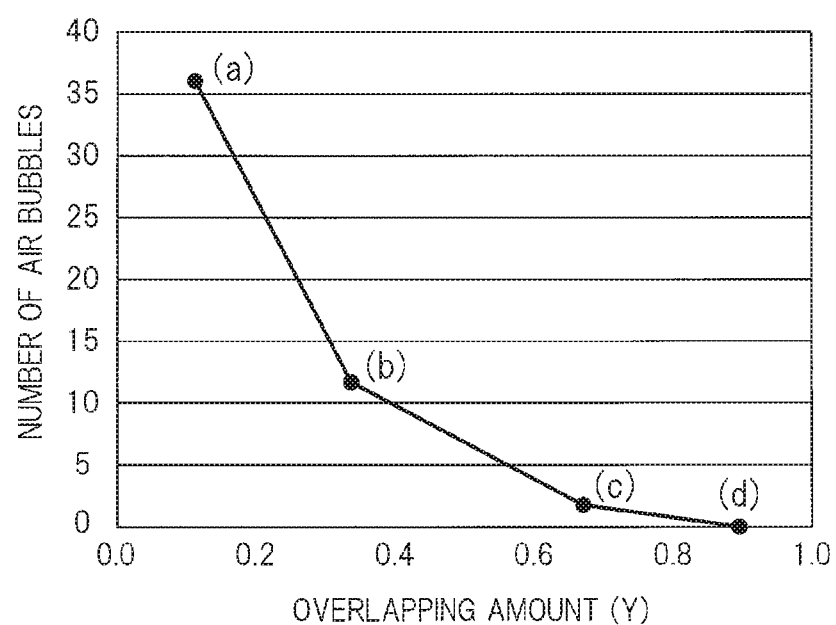
FIG. 14 is a graph showing a relation between the number of air bubbles and an overlapping amount between a lead and a gate portion during a "molding" process of the semiconductor device according to the present embodiment.

Next, a manufacturing method of the semiconductor device of the present embodiment will be described. FIG. 8 is a process flowchart showing a manufacturing process of the semiconductor device of the present embodiment. FIGS. 9 to 11 are plan views each showing the semiconductor device of the present embodiment during the manufacturing process. FIG. 12 is a cross-sectional view taken along a line XII-XII of FIG. 11. FIG. 13 is a perspective plan view showing the semiconductor device of the present embodiment. FIG. 14 is a graph showing the relation between the number of air bubbles and an overlapping amount between the leads and the gate portion in a "molding" process of the semiconductor device of the present embodiment. FIGS. 15 to 22 are plan views each describing the "molding" process of the semiconductor device of the present embodiment.

1. Preparing Lead Frame

First, a lead frame 7 is prepared as shown in FIG. 9. Four product forming regions 7a, 7b, 7c and 7d are provided on the lead frame 7 in the X direction. The product forming regions 7a, 7b, 7c and 7d are each surrounded by frame portions (coupling portions) 7e extending in the Y direction and frame portions (coupling portions) 7f extending in the X direction. In FIG. 9, although only one row of the four product forming regions 7a, 7b, 7c and 7d arranged in the X direction is shown, a plurality of rows of the four product forming regions 7a, 7b, 7c and 7d are arranged on the lead frame 7 in the Y direction.

As described above with reference to FIG. 5, the die pads 4a and 4b, the plurality of leads 2a, 2b, 2c, 2d and 2e and the suspension leads 3 are formed within each of the four product forming regions 7a, 7b, 7c and 7d. One end of each of the leads 2a, 2b, 2c, 2d and 2e is attached to the corresponding frame portion 7f extending in the X direction, and each of the suspension leads 3 is attached to the corresponding frame portion 7e extending in the Y direction. In addition, the leads 2a, 2c and 2d are coupled to one another via a first tie bar 7g extending in the X direction so as to be attached to the frame portion 7e.

The leads 2b and 2e are each coupled to one another via a second tie bar 7h extending in the X direction so as to be attached to the frame portion 7e. Additionally, the die pad 4a and the die pad 4b are located between the first tie bar 7g extending in the X direction and the second tie bar 7h extending in the X direction. In other words, the die pad 4a is located between the first tie bar 7g and the die pad 4b. The die pad 4b is located between the second tie bar 7h and the die pad 4a. In addition, the plurality of leads 2a, 2c and 2d each include the inner lead portion IL located closer to the die pad 4a than to the first tie bar 7g in the Y direction and the outer lead portion OL located farther from the die pad 4a than from the first tie bar 7g in the Y direction. In other words, the inner lead portion IL of some of the leads 2a is located between the first tie bar 7g and the die pad 4a in the Y direction. The inner lead portion IL of each of the leads 2c and 2d is not located between the first tie bar 7g and the die pad 4a in the Y direction.

The plurality of leads 2b and 2e each include the inner lead portion IL located closer to the die pad 4b than to the second tie bar 7h and the outer lead portion OL located farther from the die pad 4b than from the second tie bar 7h in the Y direction. In other words, the inner lead portion IL of some of the leads 2b is located between the second tie bar 7h and the die pad 4b in the Y direction. The inner lead portion IL of one of the leads 2e is not located between the second tie bar 7h and the die pad 4b in the Y direction.

In addition, the inner lead portion IL of each of the leads 2a, 2b, 2c, 2d and 2e is covered by the encapsulation body 1 in the molding process (encapsulating process) described below, and the outer lead portion OL of each of the leads 2a, 2b, 2c, 2d and 2e is exposed to the outside of the encapsulation body 1. The die pad 4a includes the long side 4ac extending along the first tie bar 7g, the long side 4ad opposite to long side 4ac and extending along the second tie bar 7h, the short side 4ae extending along the Y direction, and the short side 4*af* opposite to the short side 4*ae* and extending along the Y direction (see FIG. 5). Here, the long side 4*ac* of the die pad 4*a* is located between the first tie bar 7*g* and the long side 4*ad* of the die pad 4*a* with reference to FIGS. 5 and 9. Additionally, when the first virtual line is defined by the line passing through the midpoint M1 between the first tie bar 7*g* and the second tie bar 7*h* in the Y direction (in other words, the midpoint of the short side 1*f*) and extending in the X direction, the distance L3 from the first virtual line to the long side 4*ac* of the die pad 4*a* in the Y direction is greater than the length L1 of the inner lead portion IL of some of the leads 2*a* in the Y direction. A length L2 of the inner lead portion IL of each of the leads 2*d* in the Y direction is greater than the length L1 of the inner lead portion IL of some of the leads 2*a* in the Y direction.

In addition, as shown in FIG. 9, openings OPG and OPV extending through the lead frame 7 in the thickness direction thereof are respectively formed on the frame portions 7*e* that sandwich the product forming regions 7*a*, 7*b*, 7*c* and 7*d* in the X direction. The opening OPG located within each of the product forming regions 7*a* and 7*c* is formed on the die pad 4*a* side with respect to the suspension leads 3 in the Y direction, and the opening OPV located within each of the product forming regions 7*a* and 7*c* is formed on the die pad 4*b* side with respect to the suspension leads 3 in the Y direction. Conversely, the opening OPG located within each of the product forming regions 7*b* and 7*d* is formed on the die pad 4*b* side with respect to the suspension leads 3, and the opening OPV is formed on the die pad 4*a* side with respect to the suspension leads 3. Namely, the opening OPG and the opening OPV are arranged so as to be opposite to each other with respect to the suspension leads 3 in the Y direction.

The lead frame 7 is formed of a copper (Cu) member or an alloy member called Alloy 42 which is composed of iron (Fe) and nickel (Ni), and its surface may be plated as necessary with silver (Ag), or may be plated in the order of nickel (Ni)/palladium (Pd)/gold (Au) or the like.

2. Die-Bonding

Next, as shown in FIG. 10, the semiconductor chip CH1 is mounted on the die pad 4*a* via, for example, the adhesive layer 6 (see FIG. 6). Likewise, the semiconductor chip CH2 is mounted on the die pad 4*b* via, for example, another adhesive layer 6 (see FIG. 6). As described above, the plane size of the semiconductor chip CH1 in the X and Y directions is smaller than the plane size of the die pad 4*a* in the X and Y directions, and the plane size of the semiconductor chip CH2 in the X and Y directions is smaller than the plane size of the die pad 4*b* in the X and Y directions. Namely, the semiconductor chip CH1 is arranged so as to be contained within the die pad 4*a* in plan view, and the semiconductor chip CH2 is arranged so as to be contained within the die pad 4*b* in plan view as shown in FIG. 10.

Here, the adhesive layer 6 may be made of an electrically conductive member such as an epoxy resin known as a silver paste comprising silver powder or a solder material.

3. Wire-Bonding

Subsequently, as shown in FIG. 10, the plurality of leads 2*a* and the pad electrodes PD formed within the semiconductor chip CH1 are electrically connected to each other via the wires 5. In addition, the plurality of leads 2*b* and the pad electrodes PD formed within the semiconductor chip CH2 are electrically connected to each other via the wires 5. Furthermore, the pad electrodes PD of the semiconductor chip CH1 and the pad electrodes PD of the semiconductor chip CH2 are electrically connected to each other via the wires 5.

Here, the wires 5 may be made of copper (Cu) wires, gold (Au) wires, silver (Ag) wires, aluminum (Al) wires, or the like. Note that, for example, the copper wires comprise copper as a main component as well as additives other than copper (for example, palladium (Pd)). The gold wires, silver wires, and aluminum wires also comprise additives as well.

Note that the outer shape of the encapsulation body 1 is denoted by broken lines in FIG. 10.

4. Molding (Encapsulating)

Next, for example, the die pads 4*a* and 4*b*, the semiconductor chips CH1 and CH2, the wires 5, a portion of each of the leads 2*a*, 2*b*, 2*c*, 2*d* and 2*e* (inner lead portion IL described with reference to FIG. 5) and the suspension leads 3 are encapsulated by the encapsulation body 1 made of resin as shown in FIG. 11. In FIG. 11, the resin 9 is denoted by stippled dots, and an inside of the encapsulation body 1 is shown in a perspective view. In the molding process, the semiconductor device SD in the product forming region 7*a* will be mainly described, but the semiconductor devices SD in the other product forming regions 7*b*, 7*c* and 7*d* are also formed in the same manner.

As shown in FIG. 12, the lead frame 7 is sandwiched between the upper mold 8*a* and the lower mold 8*b* of the mold 8, and the resin 9 is filled into the cavity 8*c* from the gate portion G1 to form the encapsulation body 1. The die pads 4*a* and 4*b*, the semiconductor chips CH1 and CH2, the wires 5, the portion of each of the leads 2*a*, 2*b*, 2*c*, 2*d* and 2*e* (inner lead portion IL described with reference to FIG. 5), and the suspension leads 3 are located within the cavity 8*c* of the mold 8. Note that, although the mold located on the main surface side of the semiconductor chip CH1 in FIG. 12 is referred to as the upper mold 8*a* and the mold located on the back surface side of the semiconductor chip CH1 is referred to as the lower mold 8*b*, the positional relation between the upper mold 8*a* and the lower mold 8*b* may be reversed.

In addition, as shown in FIG. 12, when the lead frame 7 is sandwiched between the upper mold 8*a* and the lower mold 8*b* of the mold 8, the gate portion G1 is provided so as to overlap the frame portions 7*e*. In addition, as shown in FIG. 11 or 12, when the lead frame 7 is sandwiched between the upper mold 8*a* and the lower mold 8*b* of the mold 8, the gate portion G1 on the lower mold 8*b* of the mold 8 is located closer to the first tie bar 7*g* than to the second tie bar 7*h* in plan view. When the lead frame 7 is sandwiched between the upper mold 8*a* and the lower mold 8*b* of the mold 8 as shown in FIG. 11, the portion of the inner lead portion IL of each of the leads 2*d* is located between the die pad 4*a* and the gate portion G1 in plan view. Further, as shown in FIG. 11 or 12, the resin 9 is supplied into the cavity 8*c* in a state where the lead frame 7 is sandwiched between the upper mold 8*a* and the lower mold 8*b* of the mold 8, such that the portion of the inner lead portion IL of each of the leads 2*d* is located on the second virtual line passing through the gate portion G1 and extending in an extending direction (X direction) of the first tie bar 7*g*.

As shown in FIG. 12, the gate portion G1 that serves as an injection port for injecting the resin 9 into the cavity 8*c* and the vent portion V1 that serves as a discharge port for discharging the resin 9 and the air within the cavity 8*c* to the outside of the cavity 8*c* are respectively provided on both sides of the cavity 8*c* of the mold 8. For example, although the gate portion G1 and the vent portion V1 are provided on the lower mold 8*b*, the gate portion G1 and the vent portion V1 may instead be provided on the upper mold 8*a*. In addition, as shown in FIG. 11, the vent portion and the gate portion between two adjacent product forming regions are attached to each other. For example, the vent portion V1 and the gate portion G2 between the product forming region 7a and the product forming region 7b shown in FIG. 11 are attached to each other via a groove formed on the lower mold 8b, whereby the resin 9 and the air can be flowed from the vent portion V1 to the gate portion G2.

As shown in FIG. 11, the positions of the gate portions G1 to G4 and the vent portions V1 to V4 respectively correspond to the positions of the openings OPG and OPV provided on the frame portion 7e of the lead frame 7, the width of each of the gate portions G1 to G4 is equal to the width of the corresponding opening OPG in the Y direction, and the width of each of the vent portions V1 to V4 is equal to the width of the corresponding opening OPV in the Y direction. The gate portion G1 and the vent portion V1 are arranged so as to be opposite to each other in the Y direction with respect to the suspension leads 3. The other gate portions G2 to G4 and the vent portions V2 to V4 have similar relations as the gate portion G1 and the vent portion V1.

Further, the resin 9 flows in the order of the gate portion G1, the cavity 8c of the product forming region 7a, the vent portion V1, the gate portion G2, the cavity 8c of the product forming region 7b, the vent portion V2, the gate portion G3, the cavity 8c of the product forming region 7c, the vent portion V3, the gate portion G4, the cavity 8c of the product forming region 7d, and the vent portion V4 as denoted by arrows in FIG. 11. With this flow of resin 9, the cavity 8c of each of the product forming regions 7a to 7d is filled with the resin 9 while air within the cavity 8c is discharged from the cavity 8c, thereby forming the encapsulation body 1. Here, in order to prevent the air from remaining within the cavity 8c, it is important to discharge the air within the cavity 8c and to reduce the number of air bubbles (voids) contained within the encapsulation body 1.

In FIG. 12, the flow of resin 9 within the cavity 8c of the product forming region 7a (likewise, the product forming region 7c) shown in FIG. 11 is denoted by arrows C1. The resin 9 injected into the cavity 8c from the gate portion G1 provided on the lower mold 8b diverges to an upper side and a lower side of the leads 2d and the die pad 4a, proceeds into the cavity 8c, merges at a right side region of the die pad 4a, and then is discharged to the vent portion V1.

Although the resin 9 injected from the gate portion G1 provided on the lower mold 8b flows toward the upper side of the cavity 8c (in other words, the main surface side of the leads 2d), the leads 2d are provided in the vicinity of the gate portion G1, whereby the resin 9 is forced to collide with the inner lead portion IL of one of the leads 2d (in particular, the portion extending in the Y direction orthogonal to an entry direction of the resin 9 (see FIG. 5)). In this manner, the resin 9 is diverged above and below the leads 2d, whereby the air bubbles (voids) are prevented from being taken into the resin 9. In addition, the resin 9 is forced to collide with the inner lead portion IL of one of the leads 2d (in particular, the portion extending in the Y direction orthogonal to the entry direction of the resin 9 (see FIG. 5)), whereby a flow rate of resin 9 is decreased, and thus, the air bubbles can be prevented from being taken into the resin 9. Since a cross-sectional area of the gate portion G1 is relatively smaller than a cross-sectional area of the cavity 8c, the flow rate of resin 9 immediately after the resin 9 enters the cavity 8c from the gate portion G1 is relatively greater than the flow rate of resin in other regions within the cavity 8c. Therefore, the air bubbles tend to be taken into the resin 9 immediately after the resin 9 enters the cavity 8c from the gate portion G1. In the present embodiment, the inner lead portion IL of each of the leads 2d is provided close to the gate portion G1 and is extended so as to overlap the gate portion G1 in plan view, whereby the flow rate of resin 9 can be reduced and the air bubbles can be prevented from being taken into the resin 9 or the number of air bubbles taken into the resin 9 can be reduced.

In addition, in the semiconductor device of the present embodiment, the inner lead portion IL (in particular, the portion extending in the Y direction) of each of the leads 2d close to the gate portion G1 is set to be longer than, for example, the inner lead portion IL (in particular, the portion extending in the Y direction) of each of the leads 2c on the vent portion V1 side as described above with reference to FIG. 5. Hence, as shown in FIG. 12, the resin 9 injected from the gate portion G1 is diverged above and below the leads 2d, whereby the flow rate of resin 9 is decreased, and thus, the air bubbles can be prevented from being taken into the resin 9. Namely, the number of air bubbles contained within the encapsulation body 1 can be reduced, whereby breakdown voltage between the die pad 4a (or the semiconductor chip CH1) and the die pad 4b (or the semiconductor chip CH2) can be prevented from decreasing.

Incidentally, the resin 9 is a thermosetting type epoxy resin, and its dielectric breakdown voltage is approximately 17 to 20 KVrms/mm. On the other hand, the dielectric breakdown voltage of dry air is approximately 3 KVDC/mm. Namely, if the air bubbles remain between the die pad 4a and the die pad 4b, the dielectric breakdown voltage would be decreased to 15 to 18% of the dielectric breakdown voltage in the case where no air bubble is present.

Next, FIG. 13 is a perspective plan view of the semiconductor device SD of the present embodiment showing a relation between a pattern of the lead frame 7, the encapsulation body 1, and the gate portion G1 within the product forming region 7a. The semiconductor chips CH1 and CH2, the wires 5 and other components are not shown.

The gate portion G1 and the inner lead portion IL (in particular, the portion extending in the Y direction) of each of the leads 2d overlap each other in the Y direction at the overlapping amount Y. FIG. 14 is a graph showing the relation between this overlapping amount Y and the number of air bubbles remaining within the encapsulation body 1.

Note that the overlapping amount Y refers to the overlapping amount (ratio) of the leads 2d with respect to the gate width Gw, and a total of 144 semiconductor devices have been confirmed and compared under this condition.

Point (a) of FIG. 14 corresponds to the above-described studied example, point (b) shows that the overlapping amount Y is equal to one-third of the width Gw of the gate portion G1 (Y=Gw/3), point (c) shows that the overlapping amount Y is equal to two-thirds of the width Gw of the gate portion G1 (Y=2Gw/3), and point (d) shows that the overlapping amount Y is equal to eight-ninths of the width Gw of the gate portion G1 (Y=8Gw/9) and is the point at which the number of air bubbles becomes zero.

In order to achieve the effect of the present embodiment, it is necessary to set the overlapping amount Y to be greater than the overlapping amount Y at the point (a). Namely, it is necessary to set a length of the inner lead portion IL (in particular, the portion extending in the Y direction) of the lead 2d closest to the short side 1e of the encapsulation body 1 in FIG. 13 to be greater than the length of the inner lead portion IL (in particular, the portion extending in the Y direction) of the lead 2c closest to the short side 1f. In addition, it is necessary to set the length of the inner lead portion IL (in particular, the portion extending in the Y direction) of each of the leads 2d to be greater than the length of the inner lead portion IL (in particular, the portion extending in the Y direction) of each of the leads 2a arranged so as to overlap the die pad 4a in the Y direction (with the exception of the leads 2a connected with the die pad 4a).

Additionally, the number of air bubbles at point (b) is reduced to about one-third of the number of air bubbles at point (a), whereby a significant effect of reducing the number of air bubbles can be achieved. Therefore, the overlapping amount Y is preferably set to be greater than or equal to one-third of the width Gw of the gate portion G1 (Y≥Gw/3).

Next, FIGS. 15 to 22 each show the flow of the resin 9 within the cavity 8c in the molding process. FIGS. 15 to 18 relate to the semiconductor device SD within the product forming regions 7a and 7c, and FIGS. 19 to 22 relate to the semiconductor device SD within the product forming regions 7b and 7d.

Figure 15:
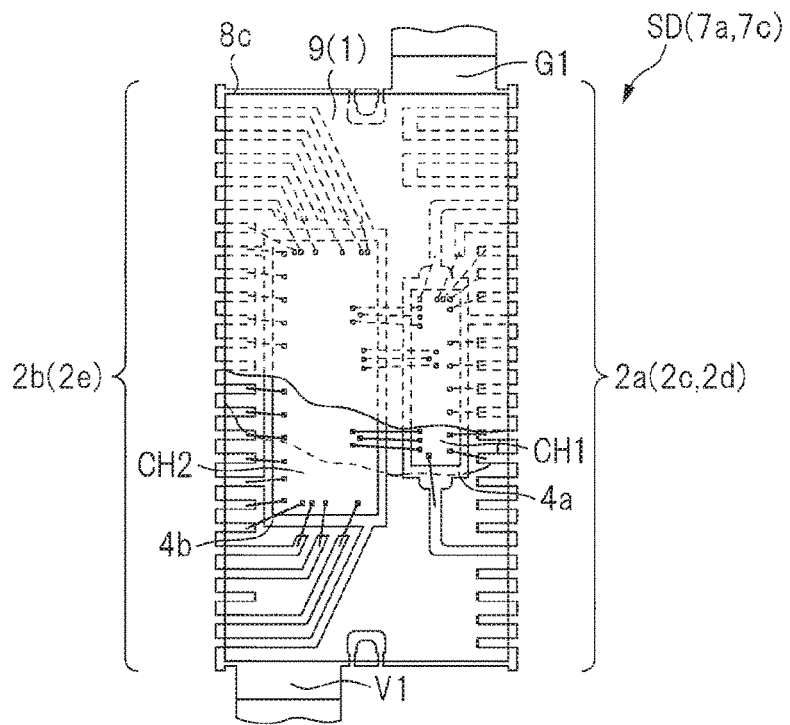
FIG. 15 is a plan view describing the "molding" process of the semiconductor device according to the present embodiment.
Figure 16:
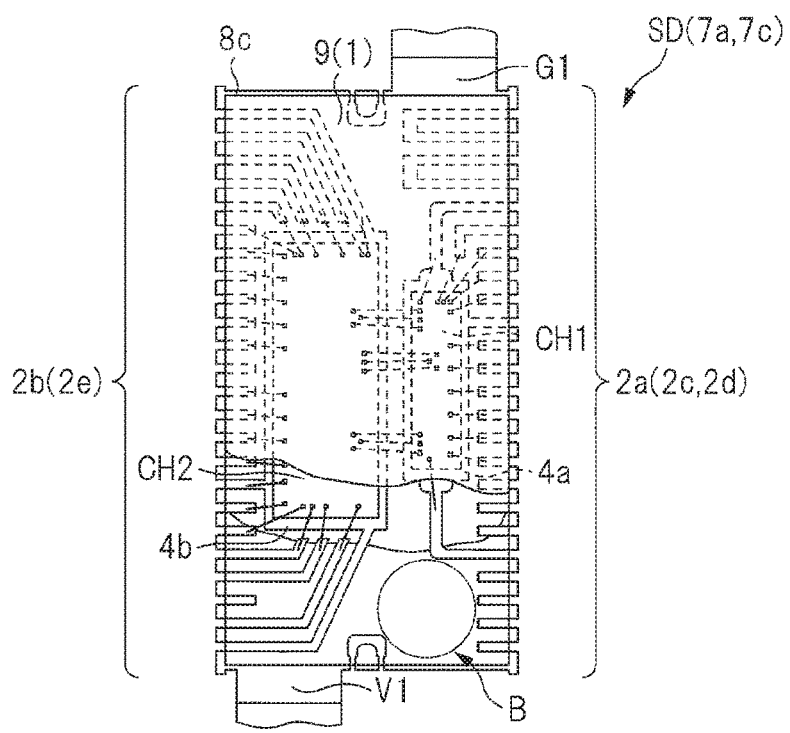
FIG. 16 is another plan view describing the "molding" process of the semiconductor device according to the present embodiment.

As shown in FIGS. 15 to 18, the resin 9 injected from the gate portion G1 flows to the vent portion V1 while pushing out the air within the cavity 8c to the vent portion V1. As described above, the resin 9 injected into the cavity 8c from the gate portion G1 collides with one of the leads 2d, diverges to the main surface side and the back surface side of the leads 2d, and then proceeds toward the vent portion V1. Since the semiconductor chip CH2 relatively larger than the semiconductor chip CH1 is mounted on the die pad 4b and is connected with more wires 5 than those of the semiconductor chip CH1, the resin 9 on the leads 2a side flows faster than the resin 9 on the leads 2b side as shown in FIGS. 15 and 16.

Figure 17:
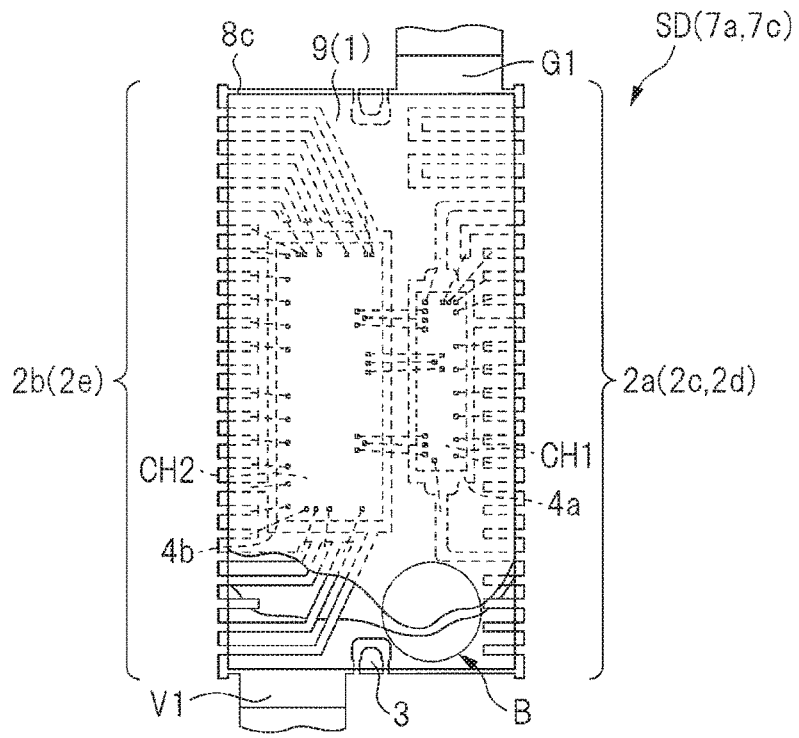
FIG. 17 is another plan view describing the "molding" process of the semiconductor device according to the present embodiment.
Figure 18:
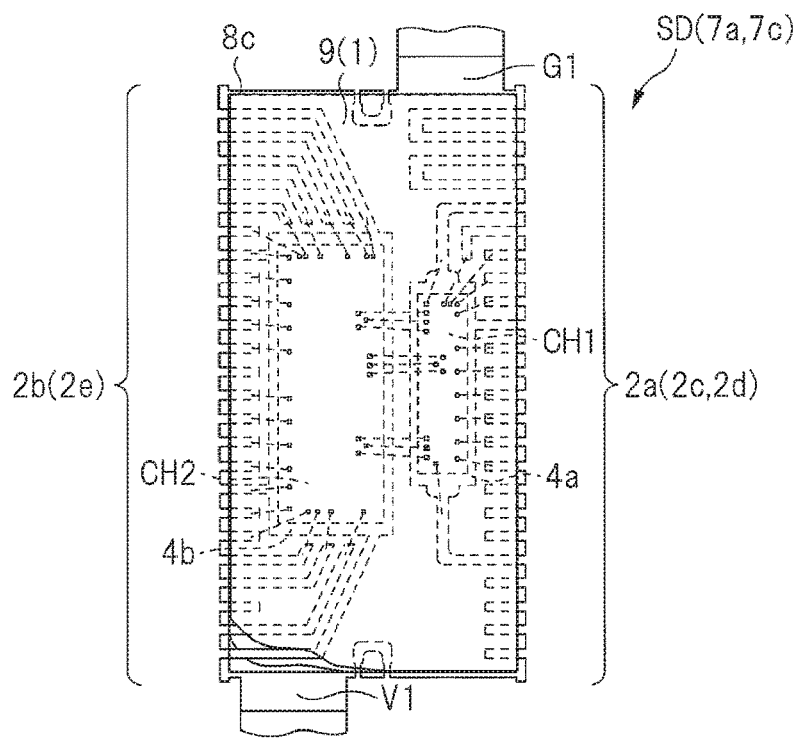
FIG. 18 is another plan view describing the "molding" process of the semiconductor device according to the present embodiment.

Next, since the inner lead portion IL (see FIG. 5) of each of the leads 2c on the leads 2a side is short, a gap portion B is formed between the leads 2c and the corresponding suspension lead 3 as shown in FIGS. 16 and 17. The resin 9 flowed through the back surface side of the die pad 4a and the resin 9 flowed through the main surface side of the die pad 4a merge at the gap portion B on the leads 2a side, whereby the flow rate of resin 9 on the leads 2a side decreases slightly compared with the flow rate of resin 9 on the leads 2b side. Then, the resin 9 on the leads 2a side and the resin 9 on the leads 2b side proceed at substantially the same speed, and the cavity 8c is filled with the resin 9 while the air within the cavity 8c is discharged to the vent portion V1, thereby forming the encapsulation body 1.

Figure 19:
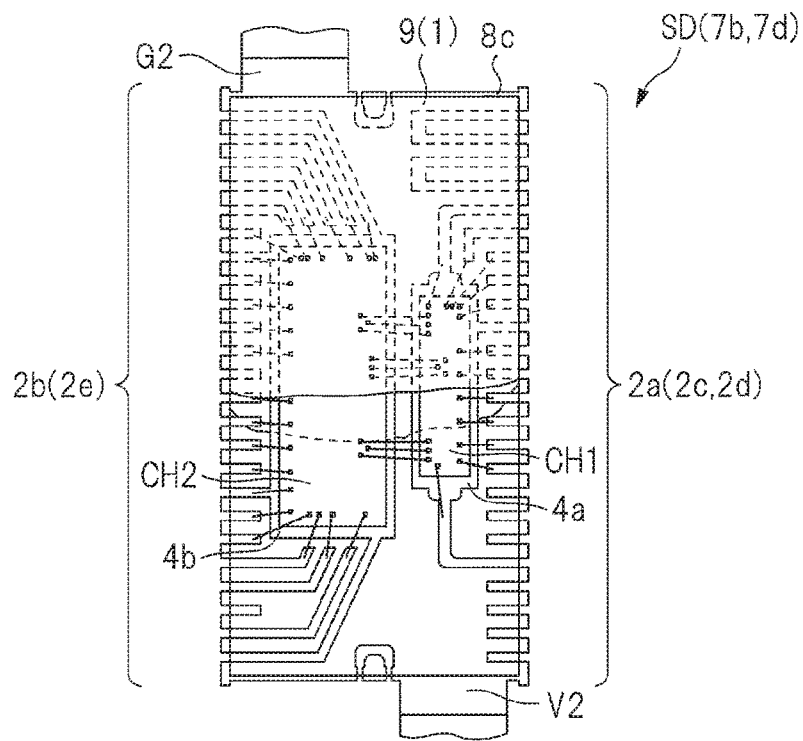
FIG. 19 is another plan view describing the "molding" process of the semiconductor device according to the present embodiment.
Figure 20:
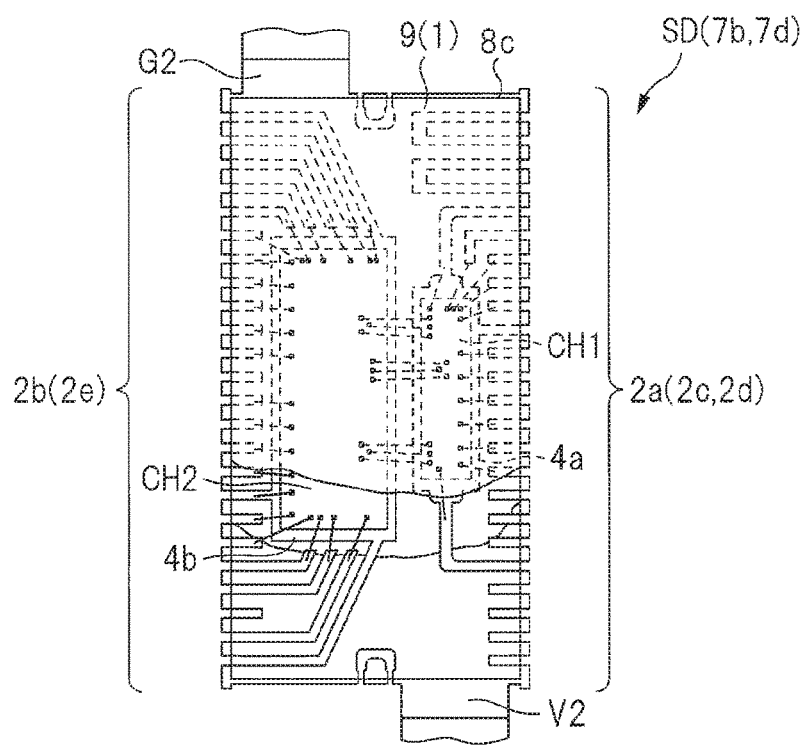
FIG. 20 is another plan view describing the "molding" process of the semiconductor device according to the present embodiment.

In addition, the resin 9 injected from the gate portion G2 flows to the vent portion V2 while pushing out the air within the cavity 8c to the vent portion V2 as shown in FIGS. 19 to 22. The resin 9 on the leads 2a side and the resin 9 on the leads 2b side proceed at substantially the same speed as shown in FIGS. 19 and 20. This is because, although the gate portion G2 is arranged on the leads 2b side, the semiconductor chip CH2 larger than the semiconductor chip CH1 and having more pad electrodes PD than those of the semiconductor chip CH1 (see FIG. 5) is mounted on the die pad 4b.

Figure 21:
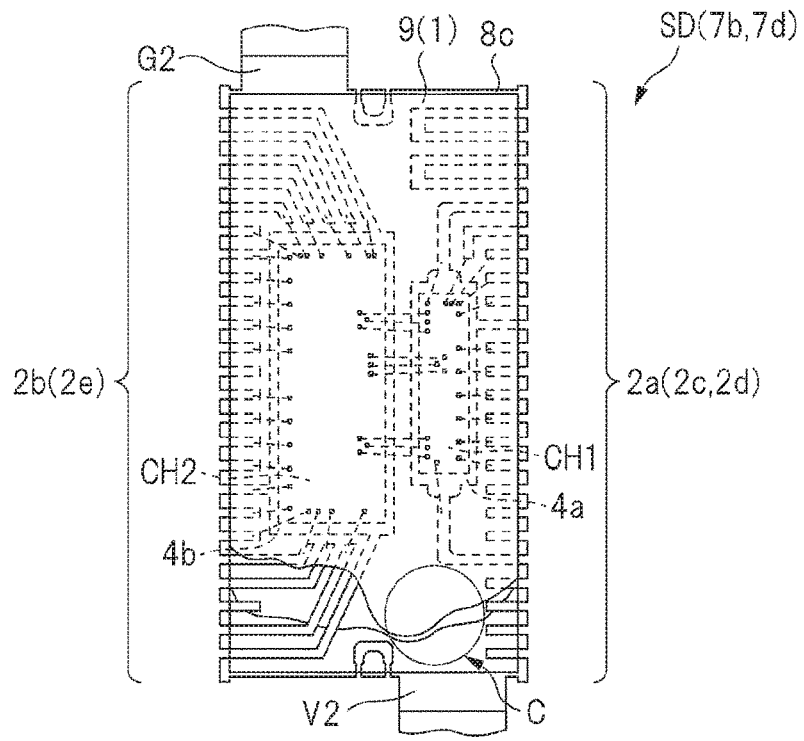
FIG. 21 is another plan view describing the "molding" process of the semiconductor device according to the present embodiment.
Figure 22:
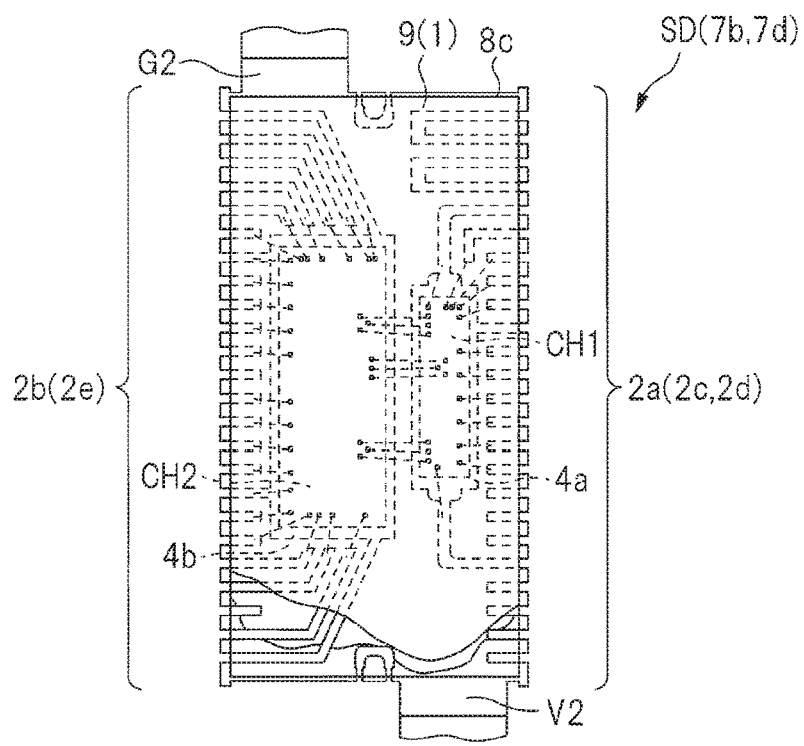
FIG. 22 is another plan view describing the "molding" process of the semiconductor device according to the present embodiment.

Next, as shown in FIG. 21, since the inner lead portion IL of each of the leads 2c on the leads 2a side is short (see FIG. 5), a gap portion C is formed between the leads 2c and the corresponding suspension lead 3. As shown in FIG. 22, since the flow rate of resin 9 on the leads 2a side decreases slightly compared with the flow rate of resin 9 on the leads 2b side at the gap portion C as described above, the cavity 8c on the leads 2b side is first filled with the resin 9, and then the cavity 8c on the leads 2a side is filled with the resin 9. Therefore, the cavity 8c can be filled with the resin 9 without leaving air within the cavity 8c, thereby forming the encapsulation body 1.

Note that, in the molding process, after injecting the resin 9 into the cavity 8c of the mold 8, the resin 9 is subjected to heat treatment as necessary at a temperature of 150 to 175° C. for 2 to 6 hours to completely cure the resin 9.

In addition, in the molding process, after forming the encapsulation body 1, the tie bar 7g described above with reference to FIG. 9 is cut to separate the leads 2a, 2b, 2c, 2d and 2e. However, the leads 2a, 2b, 2c, 2d and 2e are still attached to the frame portion 7f at an end portion of the outer lead portion OL of each of the leads 2a, 2b, 2c, 2d and 2e (see FIG. 5).

In addition, after the molding process, the resin 9 remaining within each of the gate portions G1 to G4 and the vent portions V1 to V4 is separated from the encapsulation body 1. Thus, the resin injection traces G1R and G3R and the resin discharge traces V1R and V3R are respectively formed in the semiconductor devices SD within the product forming regions 7a and 7c. In addition, the resin injection traces G2R and G4R and the resin discharge traces V2R and V4R are respectively formed in the semiconductor devices SD within the product forming regions 7b and 7d. At this time, the inner lead portion IL of each of the leads 2a to 2e is covered by the encapsulation body 1, and the outer lead portion OL of each of the leads 2a to 2e is exposed to the outside of the encapsulation body 1.

Note that by setting the distance W1 between the short side 1e and the lead 2d closest to the short side 1e to be greater than or equal to the thickness Gt of the resin injection trace G1R (thickness Gt of the gate portion G1 at a boundary of the encapsulation body 1) as described above with reference to FIG. 5 (W1≥Gt), it is possible to prevent chipping of the encapsulation body 1 that occurs when separating the resin 9 remaining within the gate portions G1 to G4 from the encapsulation body 1.

5. Plating (Exterior Plating)

Thereafter, although not shown, a plating film that serves as a conductive film is formed on the surface of each outer lead portion OL of the leads 2a to 2e. The conductive film may be made of a material such as pure tin (Sn), tin-bismuth (Sn—Bi), tin-copper-silver (Sn—Cu—Ag), tin-copper (Sn—Cu), or the like. Note that the above-described conductive film is unnecessary if the surface of the lead frame 7 is plated by nickel (Ni)/palladium (Pd)/gold (Au) or the like in advance.

6. Marking

Subsequently, although not shown, information (marks) such as product name and model number is formed on the surface of the encapsulation body 1 made of resin. The marks can be formed using a printing method or an engraving method in which a surface of the encapsulation body is irradiated with laser.

7. Lead-Forming

Next, the end portion of the outer lead portion OL of each of the leads 2a to 2e is cut from the corresponding frame portion 7f, and each of the leads 2a to 2e is formed into a gull-wing shape as shown in FIGS. 2 and 3. In this process, the encapsulation body 1 is supported by the suspension leads 3 on the frame portion 7e of the lead frame 7.

8. Singulation

Thereafter, the suspension leads 3 are cut from the frame portion 7e of the lead frame 7 to obtain a plurality of individual semiconductor devices SD. In this manner, the semiconductor device SD of the present embodiment can be manufactured.

Characteristics of Present Embodiment

As shown in FIG. 5, by setting the length of the inner lead portion IL (in particular, the portion extending in the Y direction) of each of the leads 2d to be greater than the length of the inner lead portion IL (in particular, the portion extending in the Y direction) of each of the leads 2c such that the overlapping region between the gate portion G1 and the inner lead portion IL of each of the leads 2d is increased, the air bubbles can be prevented from being taken into the resin 9 in the molding process. Therefore, the number of air bubbles contained within the encapsulation body 1 can be reduced, and reliability of the semiconductor device SD can be improved.

By reducing the number of air bubbles within the encapsulation body 1, the air bubbles can be prevented from remaining between the semiconductor chips CH1 and CH2 or between the die pads 4a and 4b, and thus, the dielectric breakdown voltage between the semiconductor chips CH1 and CH2 can be prevented from decreasing.

Additionally, as shown in FIG. 5, by setting the length of the inner lead portion IL (in particular, the portion extending in the Y direction) of each of the leads 2c to be less than the length of the inner lead portion IL (in particular, the portion extending in the Y direction) of each of the leads 2d, the air within the cavity 8c can be discharged from the vent portion V1 in the molding process as shown in FIGS. 15 to 22, and thus, the air bubbles can be prevented from remaining within the encapsulation body 1.

In addition, as shown in FIG. 13, the overlapping amount Y between the inner lead portion IL of each of the leads 2d (specifically, a portion of the inner lead portion IL linearly extending in the Y direction of) and the gate portion G1 is preferably greater than or equal to one-third of the width Gw of the gate portion G1.

In addition, as shown in FIG. 5, the separation distance W2 between the tip end of the inner lead portion IL of each of the leads 2d and the corresponding suspension lead 3 is preferably greater than or equal to the separation distance W3 between the die pad 4a and the die pad 4b. With this configuration, the creepage distance between the leads 2a, 2c and 2d protruding from the long side 1c and the leads 2b and 2e protruding from the long side 1d can be maintained.

Additionally, as shown in FIG. 5, by setting the length of the inner lead portion IL (in particular, the portion extending in the Y direction) of each of the leads 2a overlapping the die pad 4a in the X direction to be less than the length of the inner lead portion IL (in particular, the portion extending in the Y direction) of each of the leads 2d, the semiconductor device SD is capable of operating at high speed.

Among the plurality of leads protruding from the long side 1c of the encapsulation body 1, the leads 2a electrically connected with the semiconductor chip CH1 are arranged at the center portion of the encapsulation body 1 in the X direction, and the leads 2d and 2c electrically isolated (not connected via the wires 5) from the semiconductor chip CH1 are respectively arranged at both sides of the center portion. The leads 2a can be arranged close to the semiconductor chip CH1 located at the center portion of the encapsulation body 1 in the X direction, and thus, the semiconductor device SD is capable of operating at high speed.

In addition, by arranging the semiconductor chip CH1 so as to overlap the semiconductor chip CH2 (desirably, by arranging the semiconductor chip CH1 within the region of the semiconductor chip CH2) in the X direction, the wiring length of the wires 5 directly connecting the semiconductor chip CH1 and the semiconductor chip CH2 to each other can be shortened, and thus, the semiconductor device SD is capable of operating at high speed.

In the foregoing, the invention made by the present inventors has been concretely described based on the embodiment. However, it is needless to say that the present invention is not limited to the foregoing embodiment and various modifications and alterations can be made within the scope of the present invention.

Modification

Figure 23:
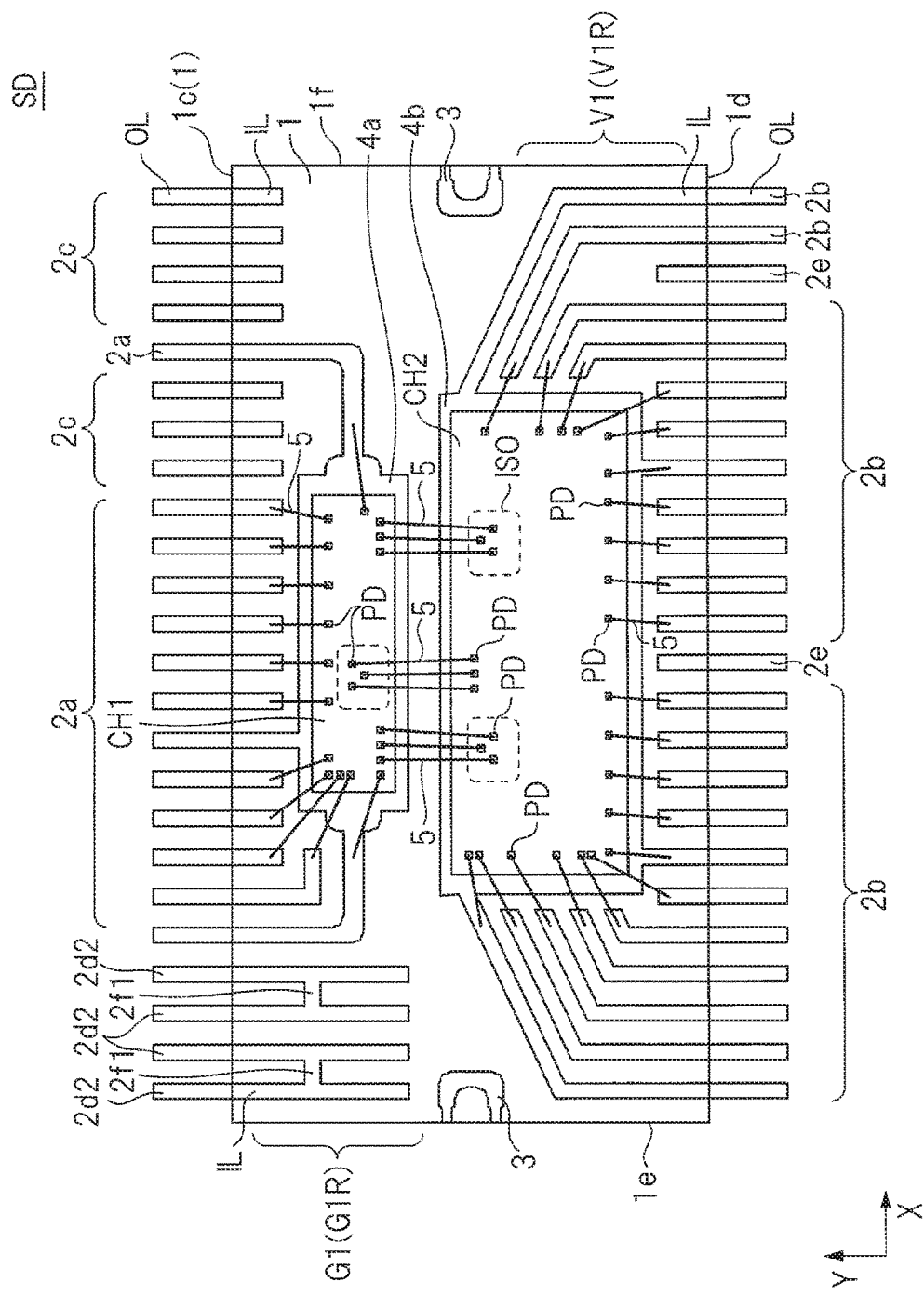
FIG. 23 is a plan view schematically showing an internal structure of a modification of the semiconductor device of FIG. 5.

FIG. 23 is a plan view schematically showing an internal structure of a modification of the semiconductor device of FIG. 5. As shown in FIG. 23, four leads 2d2 are formed close to the short side 1e of the encapsulation body 1 on which the resin injection trace G1R is located. The four leads 2d2 correspond to the leads 2d of the above-described embodiment. However, the two adjacent leads 2d2 include a coupling portion 2f1 at approximately the middle of the inner lead portion IL. Namely, the two adjacent leads 2d2 are coupled to each other at the center portion of the inner lead portion IL instead of the tip end of the inner lead portion IL.

According to this modification, a similar effect as the above-described embodiment can be achieved.

In addition, although an example in which two semiconductor chips are encapsulated within the encapsulation body has been used to describe the present embodiment, the present embodiment and its modification may be applied to a semiconductor device in which a single semiconductor chip is encapsulated within the encapsulation body and a manufacturing method of this semiconductor device. A part of the contents of the above-described embodiment will be described below by way of example.

Additional Statement 1

A semiconductor device comprising:
a first semiconductor chip including a plurality of first pad electrodes;
an encapsulation body made of resin, encapsulating the first semiconductor chip, and including: a main surface; a back surface opposite to the main surface; a first side extending along a first direction on the main surface; a second side opposite to the first side; a third side extending along a second direction orthogonal to the first direction; a fourth side opposite to the third side; a first side surface attaching the first side to the back surface; a second side surface attaching the second side to the back surface; a third side surface attaching the third side to the back surface; and a fourth side surface attaching the fourth side to the back surface; and
a plurality of first leads protruding from the first side surface and extending in the second direction, each of the first leads including an inner lead portion covered by the encapsulation body and an outer lead portion exposed to the outside of the encapsulation body,
wherein the plurality of first leads include: a plurality of second leads each connected with the corresponding first pad electrode via a first wire; a third lead that is closest to the third side among the plurality of first leads; and a fourth lead that is closest to the fourth side among the plurality of first leads, and
a length of a first portion which is a portion of the inner lead portion of the third lead extending in the second direction is greater than a length of a second portion which is a portion the inner lead portion of the fourth lead extending in the second direction.

Additional Statement 2

The semiconductor device according to additional statement 1, wherein the third lead and the fourth lead are electrically isolated from the first semiconductor chip.

Additional Statement 3

The semiconductor device according to additional statement 1,
wherein the length of the first portion which is the portion of the inner lead portion of the third lead extending in the second direction is greater than a length of a third portion which is a portion of the inner lead portion of each of the second leads extending in the second direction.

Additional Statement 4

The semiconductor device according to additional statement 1, further comprising:
a resin injection trace formed on the third side surface and arranged closer to the first side than to the second side, and
a resin discharge trace formed on the fourth side surface and arranged closer to the second side than to the first side.

Additional Statement 5

The semiconductor device according to additional statement 4,
wherein the resin injection trace has a first width in the second direction, and a region of one-third or more of the first width overlaps the first portion of the inner lead portion of the third lead.

Additional Statement 6

The semiconductor device according to additional statement 4,
wherein the resin injection trace has a first thickness in a direction from the main surface of the encapsulation body to the back surface of the encapsulation body, and a spacing between the third side and the inner lead portion of the third lead is greater than the first thickness in plan view.

Additional Statement 7

The semiconductor device according to additional statement 1, further comprising:
a second semiconductor chip including a plurality of second pad electrodes and arranged between the first semiconductor chip and the second side;
a second wire connecting each of the second pad electrodes and the corresponding first pad electrode to each other; and
a plurality of fifth leads protruding from the second side surface,
wherein the fifth leads include a plurality of sixth leads each connected with the corresponding second pad electrode via a third wire.

Additional Statement 8

The semiconductor device according to additional statement 7,
wherein the number of first leads is equal to the number of fifth leads.

Additional Statement 9

The semiconductor device according to additional statement 8,
wherein the number of sixth leads is greater than the number of second leads.

Additional Statement 10

The semiconductor device according to additional statement 7, further comprising:
a first chip mounting portion on which the first semiconductor chip is mounted;
a second chip mounting portion on which the second semiconductor chip is mounted; and
a suspension lead having an end portion exposed from the third side surface,
wherein a first separation distance between the inner lead portion of the third lead and the suspension lead in the second direction is greater than or equal to a second separation distance between the first chip mounting portion and the second chip mounting portion.

Additional Statement 11

A manufacturing method of a semiconductor device, comprising the steps of:
(a) preparing a lead frame having: a first chip mounting portion; a first semiconductor chip mounted on the first chip mounting portion and having a plurality of first pad electrodes; and a plurality of first leads provided on a periphery of the first semiconductor chip; and
(b) housing the lead frame, on which the first semiconductor chip is mounted, within a cavity formed on opposite surfaces of a first mold and a second mold, and then supplying resin into the cavity to form an encapsulation body encapsulating the first semiconductor chip, the first chip mounting portion, and the plurality of first leads,
wherein in plan view, the encapsulation body includes: a first side extending along a first direction; a second side opposite to the first side; a third side extending along a second direction intersecting the first direction; and a fourth side opposite to the third side,
in plan view, the plurality of first leads protrude from the first side of the encapsulation body, and each of the first leads includes an inner lead portion covered by the encapsulation body and an outer lead portion exposed to the outside of the encapsulation body,
the plurality of first leads include: a plurality of second leads each connected with the corresponding first pad electrode via a first wire; a third lead closest to the third side among the first leads; and a fourth lead closest to the fourth side among the first leads,
in the step (b), the resin is supplied into the cavity from a resin supply portion provided on the first mold at the third side, and
a length of a first portion which is a portion of the inner lead portion of the third lead extending in the second direction is greater than a length of a second portion which is a portion of the inner lead portion of the fourth lead extending in the second direction.

Additional Statement 12

The manufacturing method of a semiconductor device according to additional statement 11,
wherein the third lead and the fourth lead are electrically isolated from the first semiconductor chip.

Additional Statement 13

The manufacturing method of a semiconductor device according to additional statement 11, wherein the length of the first portion which is the portion of the inner lead portion of the third lead extending in the second direction is greater than a length of a third portion which is a portion of the inner lead portion of each of the second leads extending in the second direction.

Additional Statement 14

The manufacturing method of a semiconductor device according to additional statement 11,
wherein the inner lead portion of each of the second leads, the inner lead portion of the third lead, and the inner lead portion of the fourth lead extend only in the second direction.

Additional Statement 15

The manufacturing method of a semiconductor device according to additional statement 11,
wherein the plurality of first leads include a fifth lead protruding from the first side of the encapsulation body, adjacent to the third lead, and extending in the second direction in plan view, and
the fifth lead and the third lead are coupled to each other within the encapsulation body.

Additional Statement 16

The manufacturing method of a semiconductor device according to additional statement 11,
wherein the resin supply portion is formed only on the first mold and is not formed on the second mold.

Additional Statement 17

The manufacturing method of a semiconductor device according to additional statement 11,
wherein, in the step (b), the resin is discharged to the outside of the cavity from a resin discharge portion provided on the first mold at the fourth side.

Additional Statement 18

The manufacturing method of a semiconductor device according to additional statement 11,
wherein, in the step (b), the first portion of the inner lead portion of the third lead overlaps a region of one-third or more of the resin supply portion in the second direction.

Additional Statement 19

The manufacturing method of a semiconductor device according to additional statement 11, further comprising:
(c) after the step (b), removing the encapsulation body from the first mold and the second mold, and then separating the resin at a position corresponding to the resin supply portion from the encapsulation body,
wherein a distance from the third side of the encapsulation body to the inner lead portion of the third lead is greater than a thickness of the resin supply portion.

Additional Statement 20

The manufacturing method of a semiconductor device according to additional statement 11,
wherein, in the step (a), the lead frame further includes: a second chip mounting portion; a second semiconductor chip mounted on the second chip mounting portion and having a plurality of second pad electrodes; and a plurality of fifth leads provided on a periphery of the second semiconductor chip so as to protrude from the second side in plan view, and
the number of first leads is equal to the number of fifth leads.

Additional Statement 21

The manufacturing method of a semiconductor device according to additional statement 20,
wherein the plurality of fifth leads include a plurality of sixth leads each connected with the corresponding second pad electrode via a second wire, and
the number of sixth leads is greater than the number of second leads.

What is claimed is:
1. A semiconductor device comprising:
a first semiconductor chip; a second semiconductor chip; a first chip mounting portion on which the first semiconductor chip is mounted; a second chip mounting portion on which the second semiconductor chip is mounted; a plurality of first leads and a plurality of second leads each arranged on a corresponding periphery of the first chip mounting portion and the second chip mounting portion; and an encapsulation body encapsulating the first semiconductor chip, the second semiconductor chip, the first chip mounting portion, the second chip mounting portion, a portion of each of the first leads, and a portion of each of the second leads,
wherein the encapsulation body includes a main surface and a back surface opposite to the main surface,
in plan view, the main surface includes: a first side extending along a first direction; a second side opposite to the first side; a third side extending along a second direction orthogonal to the first direction; and a fourth side opposite to the third side,
the encapsulation body further includes: a first side surface attaching the first side to the back surface; a second side surface attaching the second side to the back surface; a third side surface attaching the third side to the back surface; and a fourth side surface attaching the fourth side to the back surface,
the third side surface includes a resin injection trace,
in plan view, the plurality of first leads are arranged along the first side of the main surface,
in plan view, the plurality of second leads are arranged along the second side of the main surface,
the plurality of first leads each include an inner lead portion covered by the encapsulation body and an outer lead portion exposed to the outside of the encapsulation body,
the plurality of first leads include: a third lead having the inner lead portion located between the first side and the first chip mounting portion in the second direction; and a fourth lead having the inner lead portion not located between the first side and the first chip mounting portion,
in plan view, the first chip mounting portion includes: a fifth side extending along the first side; a sixth side opposite to the fifth side; a seventh side extending along the third side; and an eighth side opposite to the seventh side and extending along the fourth side,
in plan view, the fifth side of the first chip mounting portion is located between the first side and the sixth side of the first chip mounting portion, a distance in the second direction from the fifth side of the first chip mounting portion to a first virtual line extending in the first direction and passing through a midpoint of the first side and the second side in the second direction is greater than a length of the inner lead portion of the third lead in the second direction, a length of the inner lead portion of the fourth lead in the second direction is greater than the length of the inner lead portion of the third lead in the second direction, the resin injection trace is located closer to the first side than to the second side in plan view, a portion of the inner lead portion of the fourth lead is located between the first chip mounting portion and the resin injection trace in plan view, in plan view, a spacing between the portion of the inner lead portion of the fourth lead and the resin injection trace in the first direction is smaller than a spacing between the portion of the inner lead portion of the fourth lead and the first chip mounting portion in the first direction, and in plan view, the portion of the inner lead portion of the fourth lead is located on a second virtual line passing through the resin injection trace and extending along the first side.

2. The semiconductor device according to claim 1, wherein a thickness of the resin injection trace in a third direction from the main surface to the back surface is less than a length from the third side to the fourth lead in the first direction.

3. The semiconductor device according to claim 1, wherein the first semiconductor chip includes a plurality of first pad electrodes, the second semiconductor chip includes a plurality of second pad electrodes, the number of first pad electrodes is less than the number of second pad electrodes, and a plane area of the first semiconductor chip is smaller than a plane area of the second semiconductor chip.

4. The semiconductor device according to claim 1, wherein the length of the inner lead portion of the fourth lead in the second direction is greater than the distance from the first virtual line to the first side of the first chip mounting portion in the second direction.

5. The semiconductor device according to claim 1, wherein the fourth lead is not electrically connected with either the first semiconductor chip or the second semiconductor chip.

6. The semiconductor device according to claim 1, wherein the plurality of first leads include a fifth lead having the inner lead portion not located between the first side and the first chip mounting portion, in plan view, the third lead is located between the fourth lead and the fifth lead, and a length of the inner lead portion of the fifth lead in the second direction is less than the length of the inner lead portion of the fourth lead in the second direction.

7. The semiconductor device according to claim 1, wherein the plurality of first leads include a sixth lead having the inner lead portion not located between the first side and the first chip mounting portion in the second direction, in plan view, the sixth lead is located between the third lead and the fourth lead, and the inner lead portion of the sixth lead and the inner lead portion of the fourth lead are connected to each other.

\* \* \* \* \*